US007692986B2

(12) United States Patent
Kajigaya

(10) Patent No.: US 7,692,986 B2
(45) Date of Patent: Apr. 6, 2010

(54) SEMICONDUCTOR MEMORY DEVICE FOR PRECHARGING BIT LINES EXCEPT FOR SPECIFIC READING AND WRITING PERIODS

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 57 days.

(21) Appl. No.: 12/119,909

(22) Filed: May 13, 2008

(65) Prior Publication Data

US 2008/0291762 A1 Nov. 27, 2008

(30) Foreign Application Priority Data

May 25, 2007 (JP) ............................. 2007-139105

(51) Int. Cl.
*G11C 7/00* (2006.01)
(52) U.S. Cl. ....................................... 365/203; 365/207
(58) Field of Classification Search ................. 365/203, 365/207, 189.04
See application file for complete search history.

(56) References Cited

U.S. PATENT DOCUMENTS 5,652,729 A * 7/1997 Iwata et al. .................. 365/222
7,123,509 B2 * 10/2006 Ohsawa ...................... 365/184
7,539,041 B2 * 5/2009 Kim et al. ................... 365/149

FOREIGN PATENT DOCUMENTS

JP       09-246483 A    9/1997

OTHER PUBLICATIONS

Mario M. Pelella, et al., "Low-Voltage Transient Bipolar Effect Induced by Dynamic Floating-Body Charging in Scaled PD/SOI MOSFET's," IEEE Electron Device Letters, vol. 17, No. 5, May 1996, pp. 196-198.
B. Goebel, et al., "Fully depleted surrounding gate transistor (SGT) for 70 nm DRAM and beyond", IEDM '02, Digest of Technical Papers, 2002, pp. 275-278.
Andy Wei, et al., "Measurement of Transient Effects in SOI DRAM/SRAM Access Transitors", IEEE Electron Device Letters, vol. 17, No. 5, May 1996, pp. 193-195.

* cited by examiner

*Primary Examiner*—Anh Phung
(74) *Attorney, Agent, or Firm*—Sughrue Mion, PLLC

(57) ABSTRACT

A semiconductor memory device includes a memory cell having an FET of a floating body type, and a capacitor for storing a data charge; a bit line to which the source or the drain of the FET is connected; a precharging device for performing precharge control so that the bit line has a predetermined precharge voltage; a sense amplifier for amplifying and storing the potential of the bit line, which is set in accordance with the data charge read from the memory cell; a switching device, provided between the bit line and the sense amplifier, for performing selective connection therebetween; and a control part for controlling the precharging device, the sense amplifier, and the switching device. Except for each period for performing data reading or writing, the control part makes the precharging device perform the precharge control and makes the switching device disconnect the bit line from the sense amplifier.

9 Claims, 14 Drawing Sheets

FIG. 6

| OPERATION OF MEMORY ARRAY | SELECTED BIT LINE | NON-SELECTED BIT LINE |
|---|---|---|
| PRECHARGE | VSS | VSS |
| "H" CELL-DATA READING | VSS+α | VSS+α |
| START OF PAGE MODE ACCESS PERIOD | VSS | VSS |
| "L" DATA WRITING TO SELECTED CELL | VSS | VSS |
| END OF PAGE MODE ACCESS PERIOD | VSS | VSS |
| CELL-DATA REWRITING | VSS | VDL |
| PRECHARGE | VSS | VSS |
| "L" CELL-DATA READING | VSS | VSS |
| START OF PAGE MODE ACCESS PERIOD | VSS | VSS |
| "H" DATA WRITING TO SELECTED CELL | VSS | VSS |
| END OF PAGE MODE ACCESS PERIOD | VSS | VSS |
| CELL-DATA REWRITING | VDL | VSS |
| PRECHARGE | VSS | VSS |

FIG. 14

| OPERATION OF MEMORY ARRAY | SELECTED GBL | SELECTED LBL | NON-SELECTED GBL | NON-SELECTED LBL |
|---|---|---|---|---|
| PRECHARGE | VDL | VSS | VDL | VSS |
| "H" CELL-DATA READING | VSS | VSS+α | VSS | VSS+α |
| START OF PAGE MODE ACCESS PERIOD | VDL | VSS | VDL | VSS |
| "L" DATA WRITING TO SELECTED CELL | VSS | VSS | VDL | VSS |
| END OF PAGE MODE ACCESS PERIOD | VSS | VSS | VDL | VSS |
| CELL-DATA REWRITING | VSS | VSS | VDL | VDL |
| PRECHARGE | VDL | VSS | VDL | VSS |
| "L" CELL-DATA READING | VDL | VSS | VDL | VSS |
| START OF PAGE MODE ACCESS PERIOD | VSS | VSS | VSS | VSS |
| "H" DATA WRITING TO SELECTED CELL | VDL | VSS | VSS | VSS |
| END OF PAGE MODE ACCESS PERIOD | VDL | VSS | VSS | VSS |
| CELL-DATA REWRITING | VDL | VDL | VSS | VSS |
| PRECHARGE | VDL | VSS | VDL | VSS |

SEMICONDUCTOR MEMORY DEVICE FOR PRECHARGING BIT LINES EXCEPT FOR SPECIFIC READING AND WRITING PERIODS

BACKGROUND OF THE INVENTION

1. Field of the Invention

The present invention relates to a semiconductor memory device, and in particular, those which use an SOI (silicon on insulator) substrate.

Priority is claimed on Japanese Patent Application No. 2007-139105, filed May 25, 2007, the contents of which are incorporated herein by reference.

2. Description of the Related Art

In an SOI substrate which is widely used in semiconductor devices, an (embedded) insulating film is provided on a silicon substrate, and a silicon layer is further provided thereon.

A semiconductor memory device using the above-described SOI and having an FBC (floating body cell) memory cell has been developed, in which a part corresponding to the channel area of a MOS transistor (as a floating-body transistor) formed in a silicon layer on an embedded insulating film is formed as a floating body where a charge as data is stored.

In a DRAM (dynamic random access memory) cell which uses such a floating-body transistor as an access transistor, when a time period in which the bit-line (electric) potential of each non-selected cell is H (high) is long, a charge is stored in the relevant floating-body area, and the potential thereof increases.

After that, at the instant when the level of the bit-line potential shifts to L (low), a leakage current flows due to a parasitic bipolar action, by which the charge as the data (i.e., data charge) stored in the relevant capacitor is lost, and an erroneous operation such as a data loss occurs. Such a phenomenon may be found in Non-Patent Documents 1, 2, and 3.

Generally, in most DRAMs, each bit line is pre-charged at an intermediate potential between H and L. In this case, if the above-described floating body is applied to the access transistor of a DRAM cell, and a bit line, which has not been accessed for a relatively long time, is accessed, then at the instant when the bit line shifts from the intermediate potential to the L-level potential, a data charge stored in another non-selected memory cell connected to the present bit line is lost.

In addition, the potential of the floating body increases due to the charge stored in the relevant floating body area, so that the threshold voltage of the access transistor is decreased.

In accordance with such a decrease in the threshold voltage, the subthreshold leakage current of the access transistor increases, so that the data charge stored in the relevant non-selected memory cell is lost.

In order to solve such a problem of the data-charge loss, a DRAM having a body refresh mode for discharging a charge stored in the body of a MOS transistor is known (see, for example, Patent Document 1).

Patent Document 1: Japanese Unexamined Patent Application, First Publication No. H09-246483.
Non-Patent Document 1: "Measurement of Transient Effects in SO1 DRAM/SRAM Access Transistors", IEEE ELECTRON DEVICE LETTERS, Vol. 17, No. 5, May 1996, pp 193-195
Non-Patent Document 2: "Low-Voltage Transient Bipolar Effect Induced by Dynamic Floating-Body Charging in Scaled PD/SOI MOSFET's", IEEE ELECTRON DEVICE LETTERS, Vol. 17, No. 5, May 1996, pp 196-198
Non-Patent Document 3: "Fully depleted surrounding gate transistor (SGT) for 70 nm DRAM and beyond", IEDM '02, Digest of Technical Papers, 2002, pp 275-278

However, in Patent Document 1, as the body refresh mode is added to the normal operation mode, the operation becomes complex, which thereby increases both the circuit size and the chip area.

In addition, as a dedicated power supply for performing the body refresh is necessary, the chip area is further increased going against an important requirement for the reduction of the chip size.

Furthermore, as the body refresh is necessary in addition to the normal refresh operation, the busy rate with respect to the access prohibition to a DRAM cell increases, which affects the access time, and also causes deviation from the standard specification, thereby removing compatibility with other DRAMs.

The above problem is overcome by making the precharge potential of the relevant bit line be "L", so that no charge is stored in the floating body area.

However, in a period in which the page mode access is performed, a bit line selected within a few ten to a few hundred microseconds may maintain the H-level potential.

In this case, it is impossible to solve a problem in which at the instant when the period of the page mode access is completed and the relevant bit line is precharged to the "L" potential, a data charge stored in a non-selected memory cell, which has been connected to the precharged bit line, is lost.

SUMMARY OF THE INVENTION

In light of the above circumstances, the present invention relates to a DRAM cell whose access transistor is a floating body transistor such as a planar or pillar transistor formed on an SOI substrate, and has an object to provide a semiconductor memory device in which when a bit line is selected, it is possible to prevent data-charge loss in a non-selected memory cell which is also connected to the relevant bit line (similar to the selected memory cell), thereby improving data holding characteristics.

Therefore, the present invention provides a semiconductor memory device comprising:

a memory cell having a field effect transistor of a floating body type, and a capacitor for storing a data charge;

a bit line to which one of the source and the drain of the field effect transistor is connected;

a precharging device for performing precharge control of the bit line so that the bit line has a predetermined precharge voltage;

a sense amplifier for amplifying and storing the potential of the bit line, which is set in accordance with the data charge read from the memory cell;

a switching device, provided between the bit line and the sense amplifier, for performing selective connection therebetween; and a control part for controlling the precharging device, the sense amplifier, and the switching device, wherein except for each period for performing data reading or writing, the control part makes the precharging device perform the precharge control of the bit line and makes the switching device disconnect the bit line and the sense amplifier from each other.

In a typical example:

when performing the data reading and rewriting, the control part:

makes the sense amplifier amplify the data charge read onto the bit line, and then switches off the switching device so as to disconnect the bit line and the sense amplifier from each other;

makes the precharging device precharge the bit line to the predetermined precharge voltage; and switches on the switching device so as to connect the bit line and the sense amplifier to each other, thereby writing the data stored in the sense amplifier into the memory cell.

In another typical example:

when performing the data writing, the control part:

switches off the switching device so as to disconnect the bit line and the sense amplifier from each other;

makes the sense amplifier amplify data which is input from an external device;

makes the precharging device precharge the bit line to the predetermined precharge voltage; and switches on the switching device so as to connect the bit line and the sense amplifier to each other, thereby writing the data stored in the sense amplifier into the memory cell.

In another typical example, the semiconductor memory device further comprises:

a global bit line, to which a plurality of the bit lines are connected as local bit lines, is provided, wherein:

the sense amplifier is connected to one end of the global bit line; and the switching device is provided between the other end of the global bit line and each local bit line.

In this case, typically:

the switching device is provided between each local bit line and the global bit line; and the control part switches on the switching device corresponding to selected one of the local bit lines, so as to connect the selected local bit line to the global bit line, and switches off the switching device corresponding to each non-selected local bit line.

In a preferable example, with given first and second potentials which respectively correspond to the minimum and maximum voltage levels with respect to the amplitude of the bit line, the predetermined precharge voltage is equal to or lower than the first potential.

Typically, the field effect transistor is (i) a planar transistor formed on a silicon substrate having an SOI structure, or (ii) a pillar transistor in which one of the source and drain is formed in an upper part of a silicon pillar, and the other is formed in a lower part thereof.

In accordance with the above structure, the precharge potential of each bit line can be lower than or equal to the L level (i.e., the minimum value) with respect to the amplitude of the bit line, and the switching device is provided between the bit line and the sense amplifier, so as to perform selective connection therebetween. When reading the data charge stored in the relevant memory cell (i.e., reading target data), the signal voltage set in accordance with the data charge (read onto the relevant bit line) is transmitted to the sense amplifier, and then the switching device is switched off, so as to disconnect the bit line and the sense amplifier from each other.

The sense amplifier amplifies the transmitted signal voltage, and after the bit line and the sense amplifier are disconnected from each other, the bit line is controlled by the precharging device to have the precharge voltage. After that, a data reading or writing operation with respect to the sense amplifier is performed. In an ordinary operation mode, such an operation takes a few ten to a few hundred nanoseconds, while in a page mode, the operation takes a few ten to a few hundred microseconds.

When a precharge command is input, the switching device is switched on, so that the bit line and the sense amplifier are connected to each other, and the data stored in the sense amplifier is rewritten into the relevant memory cell via the bit line. After that, the selected word line is set to be in a non-selected state. Next, the bit line is again precharged by the precharging device, and maintains the precharge voltage.

In a hierarchical memory array structure including local bit lines (each corresponding to the above bit line) and a corresponding global bit line, a sense amplifier is provided at least at the global bit line, wherein the precharge potential of each local bit line can be lower than or equal to the L level (i.e., the minimum value) with respect to the amplitude of the bit line, and the switching device is provided between each local bit line and the global bit line, so as to perform selective connection therebetween. When reading the data from the relevant memory cell, the voltage of the signal read onto the relevant local bit line is transmitted to the global bit line, and then the switching device is switched off, so as to disconnect the local bit line and the global bit line from each other. The level of local bit line is again set to the precharge potential, and the read signal is amplified by the sense amplifier. After that, a data reading or writing operation with respect to the sense amplifier is performed. In an ordinary operation mode, such an operation takes a few ten to a few hundred nanoseconds, while in a page mode, the operation takes a few ten to a few hundred microseconds.

When a precharge command is input, the bit line and the sense amplifier are again connected to each other by means of the switching device, and the (final) data stored in the sense amplifier is rewritten into the relevant memory cell via the local bit line. After that, the switching device again disconnects the relevant local bit line from the global bit line, and the local bit line is precharged by the precharging device, and maintains the precharge voltage.

As described above, in accordance with the present invention, (i) each bit line in a non-selected memory cell (i.e., not selected using a word line) is always precharged so as to have the predetermined precharge voltage, which may be lower than or equal to the L level with respect to the amplitude of the bit line, and (ii) each bit line in a selected memory cell (i.e., by using a word line) is isolated or disconnected from the relevant sense amplifier by the switching device and is precharged so as to have the predetermined precharge voltage (which may be lower than or equal to the L level with respect to the amplitude of the bit line) except for each very short period with respect to data reading and data rewriting (which includes data writing). Therefore, with respect to each DRAM cell whose access transistor is a floating-body transistor such as a planer or pillar transistor formed on an SOI substrate, no electric charge is stored in the relevant floating body, and it is possible to prevent data-charge leakage due to a parasitic bipolar effect or a decrease in a relevant threshold voltage, thereby improving data holding characteristics of the relevant DRAM.

Also in accordance with the present invention, (i) each local bit line in a non-selected memory cell (i.e., not selected using a word line) is always precharged so as to have the predetermined precharge voltage, which may be lower than or equal to the L level with respect to the amplitude of the bit line, and (ii) each local bit line in a selected memory cell (i.e., by using a word line) is also precharged so as to have the predetermined precharge voltage (which may be lower than or equal to the L level with respect to the amplitude of the bit line) except for each very short period with respect to data reading and data rewriting (which includes data writing). Therefore, with respect to each DRAM cell whose access transistor is a floating-body transistor such as a planer or pillar transistor formed on an SOI substrate, no charge is stored in the relevant floating body, and it is possible to prevent data-charge leakage due to a parasitic bipolar effect or a decrease in a relevant threshold voltage, thereby improving data holding characteristics of the relevant DRAM.

BRIEF DESCRIPTION OF THE DRAWINGS

FIG. 6 is a table which also shows the operation of the semiconductor memory device in the first embodiment.

FIG. 14 is a table which also shows the operation of the semiconductor memory device in the second embodiment.

DETAILED DESCRIPTION OF THE INVENTION

Hereinafter, embodiments of the present invention will be described with reference to the appended figures.

Figure 1:
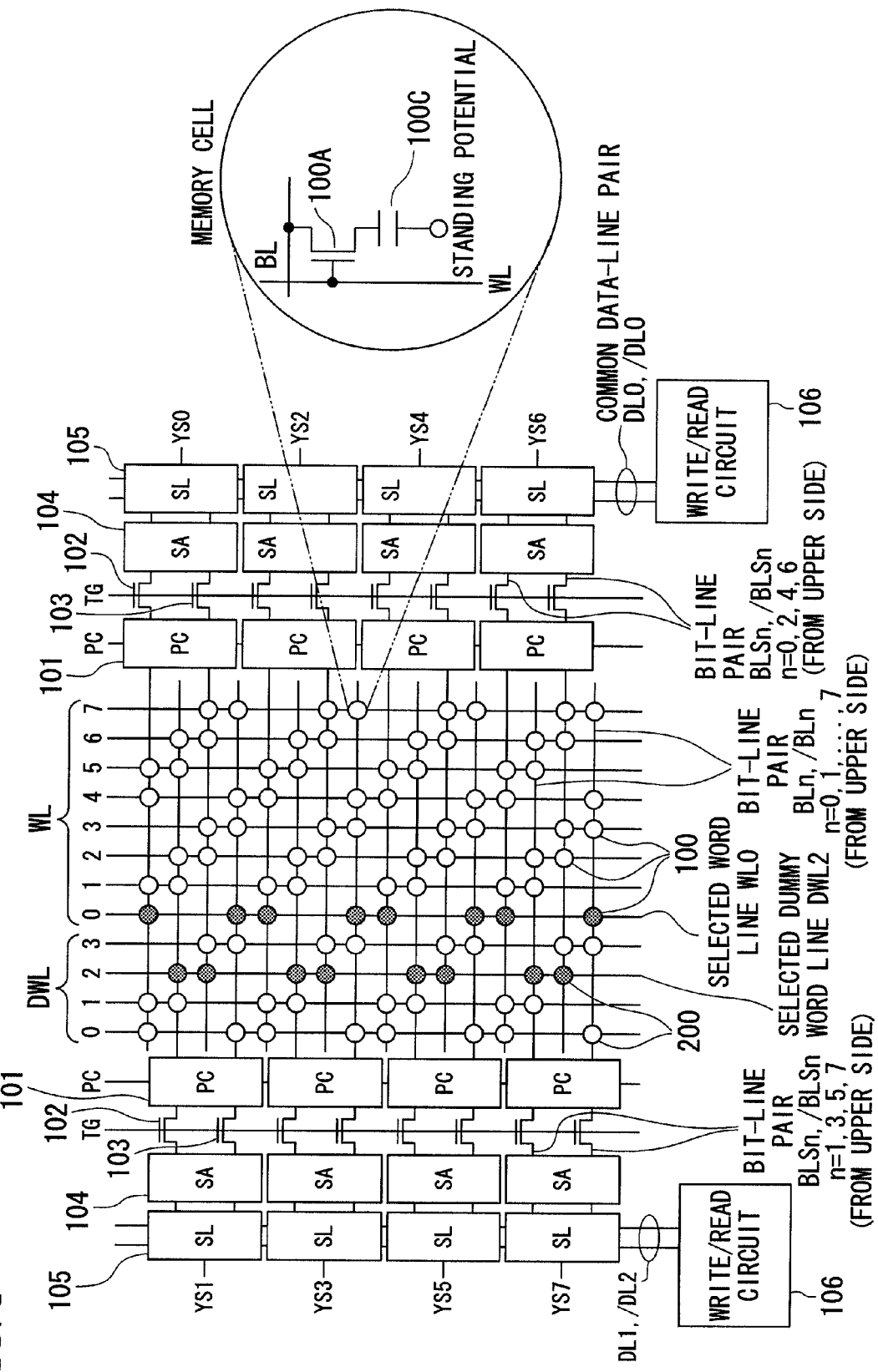
FIG. 1 is a block diagram showing the structure of a semiconductor memory device (DRAM) as a first embodiment of the present invention.

FIG. 1 is a block diagram showing the structure of a semiconductor memory device as a first embodiment of the present invention.

In FIG. 1, bit lines are arranged in a known folded form, and do not have a hierarchical structure including global and local bit lines.

Each pair of differential bit lines BL and "/BL" (i.e., differential bit-line pair) forms a complementary combination, and is connected to a sense amplifier 104 via a precharge circuit 101 and isolating transistors 102 and 103, where timing control of each signal is performed by a control circuit (not shown).

The above precharge circuit 101 and sense amplifier 104 are provided for each differential bit-line pair.

In addition, for example, each isolating transistor 102 is connected to the corresponding bit line BL, and each isolating transistor 103 is connected to the corresponding bit line "/BL".

At the intersection between each word line WL and each bit line BL (or /BL), a memory cell 100 is provided, and at the intersection between each dummy word line DWL and each bit line BL (or /BL), a dummy memory cell 200 is provided.

In the present embodiment, the bit-line pair connected to each memory cell is indicated by the pair of bit lines BL and /BL, and each bit-line pair provided between the corresponding sense amplifier 104, and the corresponding isolating transistors 102 and 103, is indicated by the pair of bit lines BLS and /BLS.

Data reading from each memory cell 100 is performed as explained below.

Each sense amplifier 104 amplifies data which is read from the relevant memory cell 100 (selected by setting the target word line WL0 to "H" (high level)) onto the corresponding bit line BL or /BL.

One of the sense amplifiers 104 is selected via sense-amplifier selectors 105 by using selection data though selection YS (Y switch) signals lines (YS0 to YS7, . . . ), and the relevant data of the selected sense amplifier 104 is transmitted to a corresponding write/read circuit 106 via a corresponding pair of common data lines DL and "/DL" (i.e., "DL0 and /DL0" or "DL1 and /DL1").

On the other hand, data writing to each memory cell 100 is performed as explained below.

In correspondence to data input from an external device, the corresponding write/read circuit 106 complementarily drives the pair of common data lines DL and /DL, so that one of these is set to the H level, and the other is set to the L level.

In response to an address input from the external device, the relevant sense-amplifier selectors 105 select the sense amplifier 104 corresponding to the address, so as to transmit the data on the common data lines DL and /DL. The sense amplifier 104 amplifies the signal voltage of the data on the common data lines DL and /DL. In this process, the control circuit sets the level of the word line corresponding to the input address to "H".

The control circuit sets the relevant isolating transistors 102 and 103 to ON (i.e., on state), and writes the data amplified by the sense amplifier 104 to the relevant memory cell 100 via the corresponding pair of bit lines BLS and /BLS, and pair of bit lines BL and /BL.

The memory cells 100 are arranged in a quarter-pitch layout, and are each provided at one of (i) the intersection between each word line WL and each relevant bit line BL and (ii) the intersection between each word line WL and each relevant bit line /BL, as shown in FIG. 1.

In addition, each memory cell 100 consists of an access transistor 100A and a capacitor 100C for storing a data charge.

The access transistor 100A is implemented by using a floating-body MOSFET such as a planar or pillar transistor formed on an SOI substrate.

In a pillar transistor formed on an SOI substrate, one of the source and drain is formed in an upper part of a silicon pillar, and the other is formed in a lower part thereof.

In the memory cell array including of the memory cells 100, dummy word lines DWL and dummy memory cells 200 are also arranged.

Similar to the memory cells 100, each dummy memory cell 200 consists of an access transistor and a capacitor for storing a data charge. However, the capacitor has a capacitance which may be half that of each memory cell 100. In addition, the capacitor always stores data of "H" (high level) by using a setting circuit (not shown).

Therefore, when a dummy memory cell 200 is selected via a dummy word line DWL, a signal having a voltage level approximately half of that of each memory cell 100 is read to the corresponding bit line BL (or /BL).

For example, when the word line WL0 is selected, the dummy word line DWL2 is selected in correspondence to the word line WL0, and the memory cells 100 and the dummy memory cells 200 connected to each word line are selected. Accordingly, data charges stored in the memory cells are read onto the corresponding pairs of bit lines BL and /BL.

That is, a data charge corresponding to data of logic "1" or "0" is read as a signal from each memory cell 100; and from the relevant dummy cell 200, a signal having approximately half of the data charge stored at the level of "H" of the relevant memory cell 100, that is, having a voltage level half of the H-level voltage, is read.

Accordingly, each sense amplifier 104 compares the voltage level corresponding to the amount of data charge read from the relevant memory cell 100 with the voltage level corresponding to the amount of data charge read from the relevant dummy memory cell 200, so as to determine whether the data read from the memory cell 100 is "H" or "L", and to amplify the "H" or "L" signal.

When a precharge (control) signal PC is set to "H", each precharge circuit 101 precharges both bit lines of the relevant pair to the ground potential (0V). Here, the precharge voltage of each bit line is set similar to or smaller than the minimum value with respect to the signal amplitude of the bit line.

When an isolating signal TG is set to "L", the isolating transistors 102 and 103 are set off, so that the relevant pair of bit lines BL and /BL and the precharge circuit 101 are isolated (i.e., disconnected) from the corresponding sense amplifier 104.

In contrast, when the isolating signal TG is set to "H", the isolating transistors 102 and 103 are set on, so that the relevant pair of bit lines BL and /BL and the precharge circuit 101 are connected to the sense amplifier 104.

Below, with reference to the waveform diagrams of FIGS. 2 to 5, the operation of the memory cell array (see FIG. 1) in the semiconductor memory device of the present embodiment will be explained.

"H" Data Reading from Memory Cell 100 and "L" Data Writing

Figure 2:
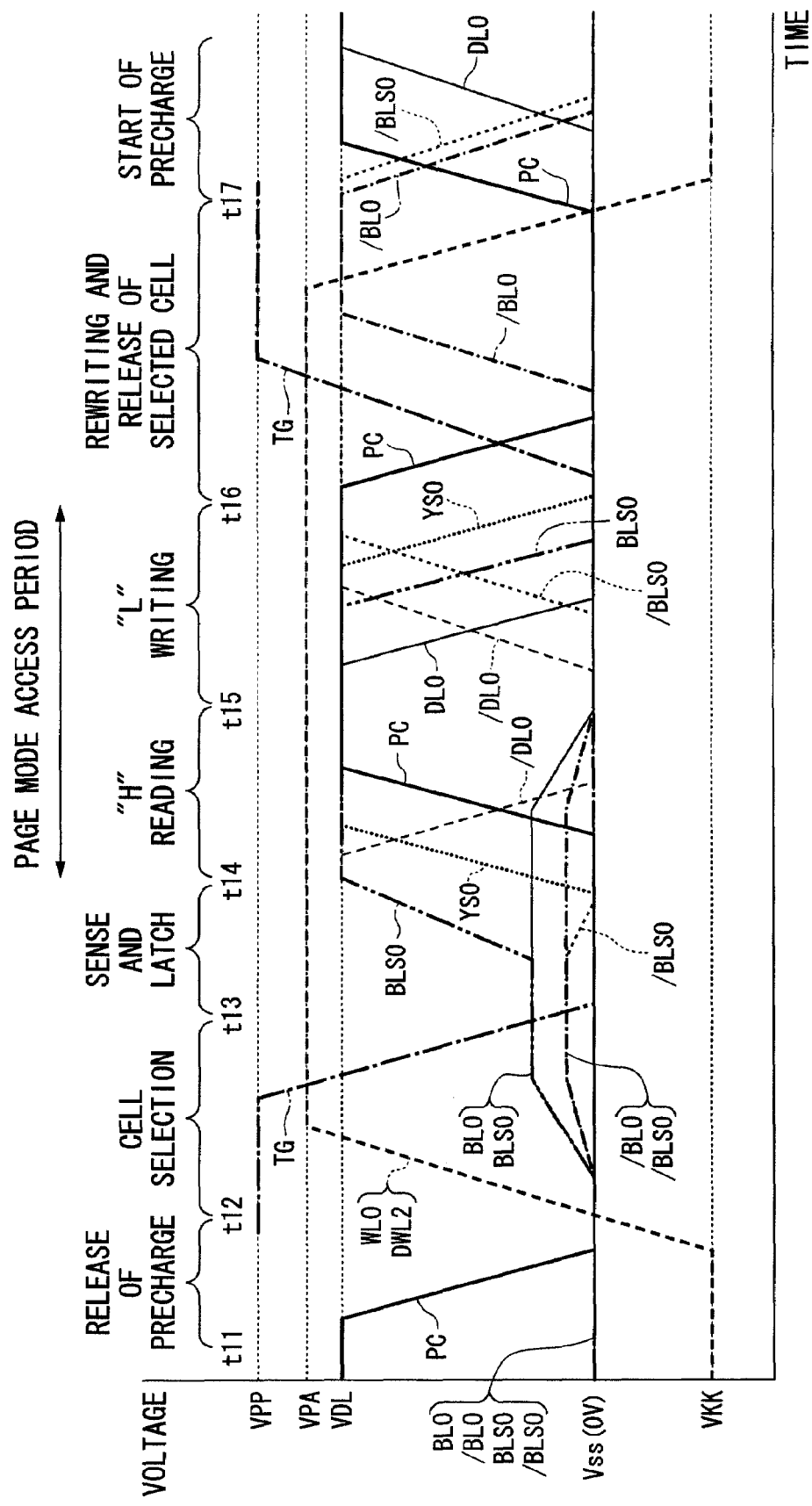
FIG. 2 is a waveform diagram showing the operation of the semiconductor memory device in the first embodiment.

FIG. 2 is a waveform diagram showing the operation of the memory array circuit (FIG. 1) of the present embodiment, and specifically shows a waveform when "H" data is read from the memory cell 100 connected to the bit line BL0 and then "L" data is written thereto. In FIG. 2, the horizontal axis indicates time, and the vertical axis indicates voltage. The ground voltage Vss is 0V, and VDL indicates a general power-supply potential such as the H level of each bit line BL (or /BL). In addition, VKK and VPA respectively indicate the L and H levels of each word line WL, and the H level of the isolating signal TG is indicated by VPP.

The above VKK, which is generated using a power supply circuit in the semiconductor memory device, has a negative voltage, while VPA and VPP are obtained by boosting VDL.

That is, VKK is set to a negative voltage so as to reduce leakage current when the access transistor 100A of the relevant memory cell 100 is OFF (i.e., in the off state), and VPA and VPP each have a boosted potential for preventing, when the access transistor 100A and the relevant one of isolating transistors 102 and 103 are ON (i.e., in the on state), the potential of the transmitted signal from dropping by a threshold voltage Vt with respect to the relevant n-channel MOS transistor.

At time t11, the semiconductor memory device is accessed by an external device, and the control circuit shifts the level of the precharge (control) signal PC from H to L. Accordingly, the precharge operation applied to the bit lines BL and /BL is terminated.

At time t12, the control circuit set the level of the relevant word lines WL0 and DWL2 to H so as to select the target memory cell 100.

Accordingly, a signal corresponding to H-level data is read from the relevant memory cell 100 to the corresponding bit lines BL0 and BLS0, and a signal having a voltage approximately half of the above H-level voltage is also read from the relevant dummy memory cell 200 to the corresponding bit lines /BL0 and /BLS0. The control circuit then shifts the level of the isolating signal TG from H to L, so that the corresponding isolating transistors 102 and 103 are OFF, and the pairs of bit lines BL and /BL are isolated from the pairs of bit lines BLS and /BLS and the sense amplifiers 104.

At time t13, that is, after the isolating signal TG is set to L, the control circuit activates the sense amplifiers 104. Accordingly, the relevant sense amplifier 104 compares the levels of voltages output to the corresponding bit lines BL0 and /BL0, and amplifies the difference thereof, thereby respectively setting the corresponding bit lines BLS0 and /BLS0 to H and L (=0V). Accordingly, a variation in the electric potential of the relevant bit lines due to the corresponding data charge is amplified and held (i.e., latched).

At this time, as the bit lines BL0 and /BL0 are isolated from the sense amplifier 104, they still hold the original potentials which have varied due to the data charge.

At time t14, the control circuit sets the level of the selection YS signal (line) YS0 (see also FIG. 1) to H, so as to select the relevant sense amplifier 104, and to read the data stored in the selected sense amplifier 104.

In this process, with respect to the relevant common data lines DL0 and /DL0, each of which has been precharged at the H level, the sense amplifier 104 maintains the H level of the common data line DL0 while setting the level of the common data line /DL0 to L, thereby transmitting (outputting) the relevant H-level data to the write/read circuit 106 by means of the above potential-level combination of the common data lines. Here, (i) when the levels of the common data lines DL0 and /DL0 are respectively H and L, data to be written or read is "H" data, and (ii) when the levels of the common data lines DL and /DL are respectively L and H, data to be written or read is "L" data.

On the other hand, the control circuit sets the level of the precharge control signal PC to H, so as to set the level of the pair of bit lines BL0 and /BL0 to L (i.e., returns the level to 0V), thereby performing the precharge operation.

At time t15, when a control signal for writing control is input from an external device, and "L" data is input as target data to be written, the write/read circuit 106 complementarily sets the levels of the common data lines DL0 and /DL0 to L and H, in correspondence to the input data. The above "complementarily" indicates an operation in which when one of the lines which form a pair is set to H, the other must be set to L, that is, both lines have opposite potentials, that is, the maximum (H) potential and the minimum (L) potential within the relevant amplitude range.

In accordance with the selection YS signal corresponding to the address of the memory cell (to which the data is written) provided by the external device, the sense amplifier 104 corresponding to the bit line to which the target memory cell is connected is selected by means of the sense-amplifier selectors 105.

The selected sense amplifier 104 is activated, and drives the connected bit lines BLS0 and /BLS0 so that they are respectively set to L and H.

At this time, as the pair of bit lines BL0 and /BL0 is isolated from the sense amplifier 104, the level thereof has been held at 0V ("L") set in the precharge operation. In addition, as the level of the word line WL0 is H, the relevant access transistor 100A is ON, so that no data charge has been stored in the capacitor 100C of the relevant memory cell 100.

Until a precharge command is input into the DRAM (i.e., the semiconductor memory device of the present embodiment) and a rewriting and selected-cell release phase starts, it is possible to perform a continuous read/write access to each memory cell which belongs to a memory cell group (called a "page") selected by the relevant word line. Generally, the period in which such a page mode access is possible has an upper limit of a few ten to a few hundred microseconds.

That is, in the page mode access period, when the selection YS signal is successively changed, each sense amplifier 104 which stores data read from the corresponding memory cell 100 is successively selected, so that the data read from each memory cell 100 is continuously output to the relevant write/read circuit 106.

Next, the precharge command is input into the DRAM, and the rewriting and selected-cell release phase (i.e., for writing the data stored in the sense amplifiers 104 and deactivating the relevant word lines (so as to have the "L" level)) starts with respect to the relevant memory cells 100. That is, at time t16, the control circuit changes the level of the precharge control signal PC from H to L, so that the pair of bit lines BL0 and /BL0 is again set to 0V (L-level), and thus set to be in a floating state.

When the control circuit changes the level of the isolating signal TG from L to H, each pair of bit lines BLS and /BLS is connected to the corresponding pair of bit lines BL and /BL, so that data (for rewriting) of the bit lines BLS0 and /BLS0 is transmitted to the corresponding bit lines BL0 and /BL0. In this process, the control circuit sets the level of the word lines WL0 and DWL2 to H.

Accordingly, in the same bit-line pair, the bit line BL0 has the L level while the bit line /BL0 has the H level, and a data charge corresponding to the L level is written into the capacitor 100C of the relevant memory cell 100.

The control circuit then changes the level of the word lines WL0 and DWL2 from H to L, so as to release the selection of the relevant memory cell 100.

Next, at time t17, the control circuit changes the level of the precharge control signal PC from L to H, so that the bit lines /BLS0 and /BL0 are returned to 0V (i.e., L level), thereby completing the precharge of the relevant bit lines.

In addition, the write/read circuit 106 precharges the pair of common data lines DL0 and /DL0 to have the H level.

In accordance with the above-described operation, a series of the processes with respect to data reading from the relevant memory cell is completed.

Refresh Operation when Memory Cell 100 has "H" Data

Below, with reference to FIG. 3, the operation of the memory cell array in FIG. 1 of the present embodiment will be further explained.

Figure 3:
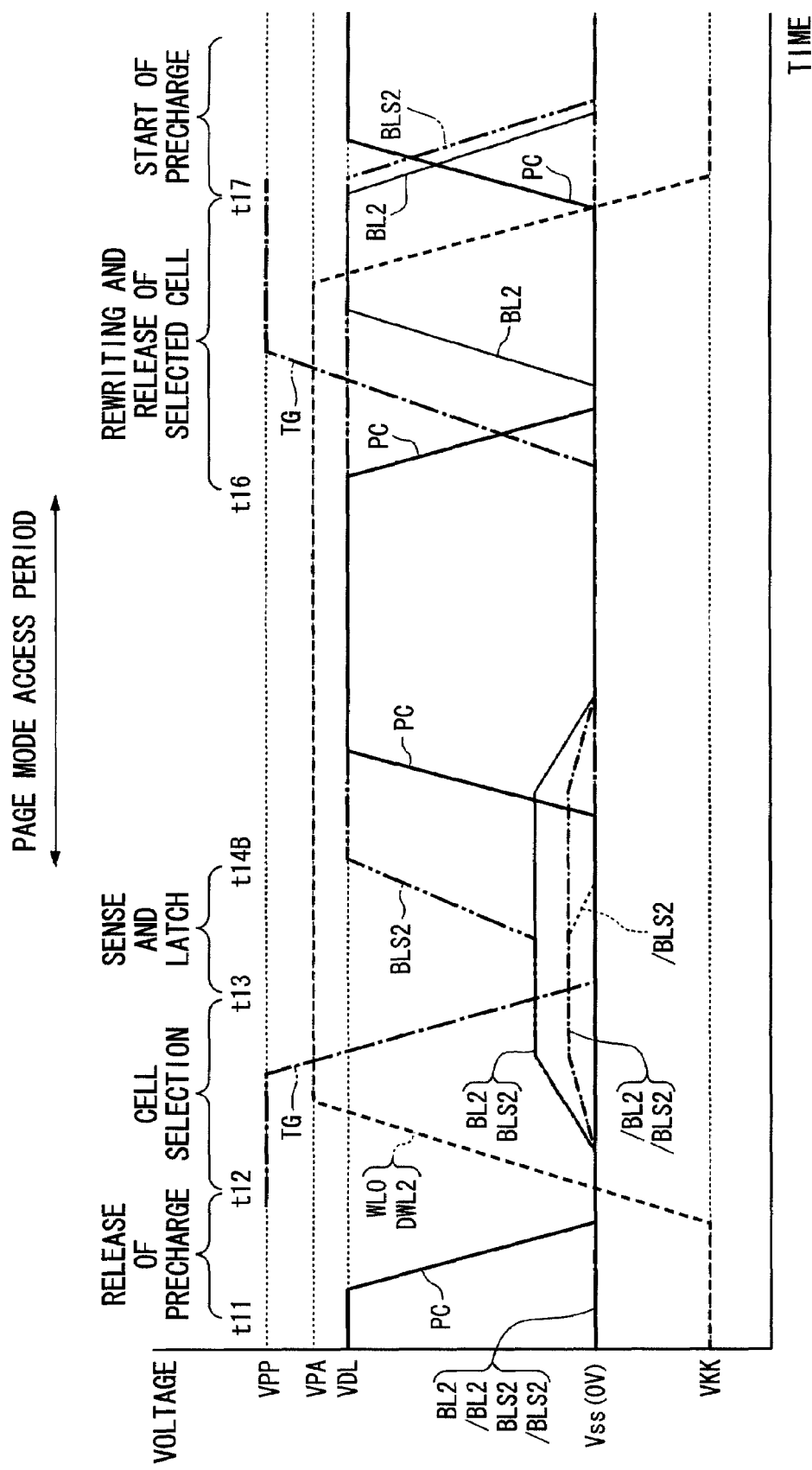
FIG. 3 is also a waveform diagram showing the operation of the semiconductor memory device in the first embodiment.

FIG. 3 is a waveform diagram with respect to the memory cell array in FIG. 1, and shows a state in which during the page mode access period, the relevant selection YS signal is not set to "H", that is, no sense amplifier 104 is selected as a target which outputs data.

FIG. 3 also shows a refresh operation in which "H" data, which is read from the relevant memory cell 100 and stored in the corresponding sense amplifier 104, is just rewritten. In FIG. 3, such an operation is applied to the pair of bit lines BL2 and /BL2.

In comparison with the operation shown in FIG. 2, during the page mode access period (from time t14B to t16), reading (at t14) and writing (at t15) are not performed with respect to the write/read circuit 106.

That is, at time t12, a data charge stored in the capacitor 100C of the relevant memory cell 100 is read, and at time t16, the H-level data stored in the corresponding sense amplifier 104 is returned (as the original) to the memory cell 100. In FIG. 2, the level of the bit line /BL0 is set to H. In contrast, in FIG. 3, the level of the bit line BL2 is set to H. This is the only difference, and the other operations are similar for both figures, and detailed explanations thereof are omitted.

"L" Data Reading and "H" Data Writing with Respect to Memory Cell 100

Figure 4:
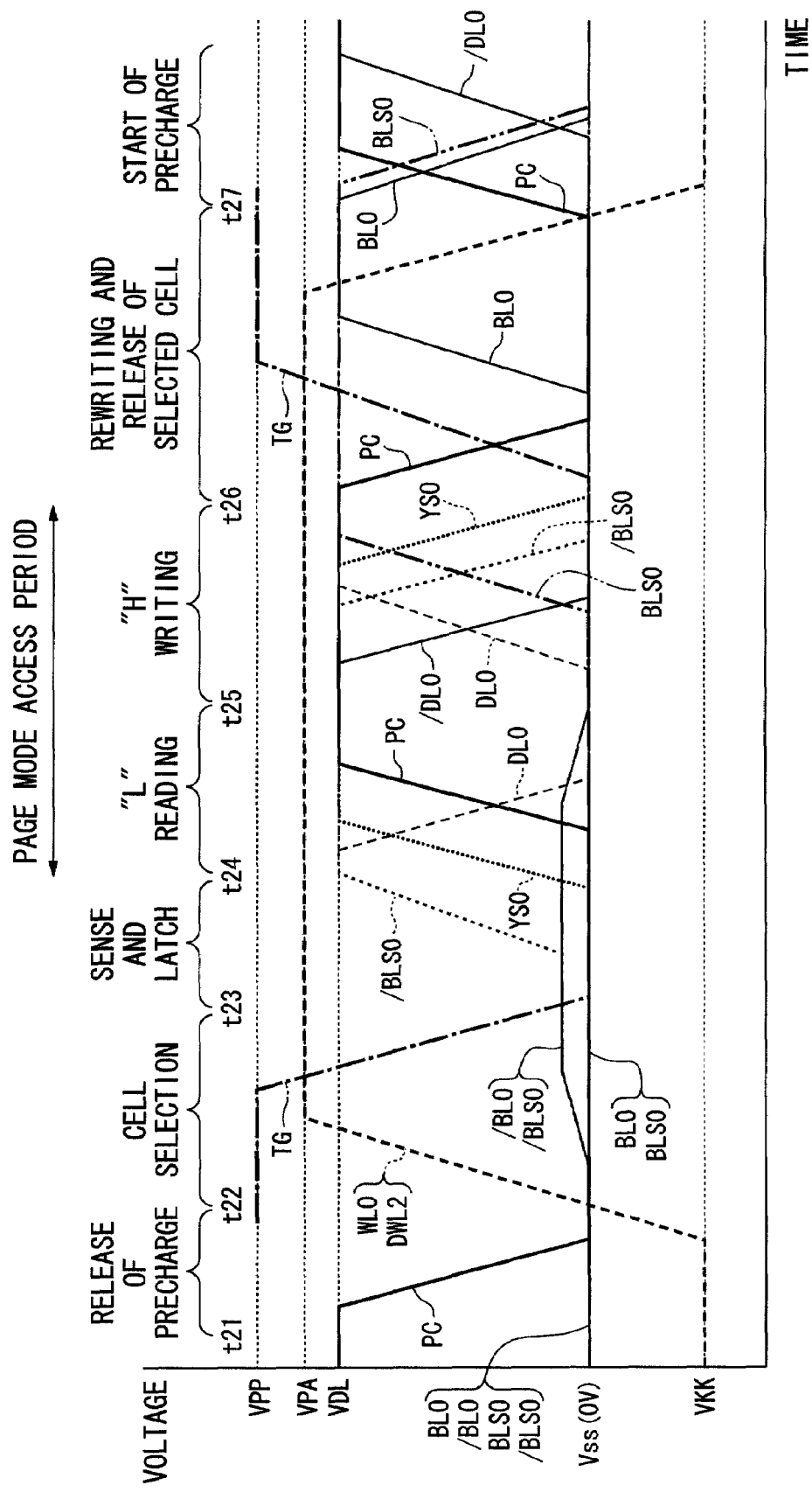
FIG. 4 is also a waveform diagram showing the operation of the semiconductor memory device in the first embodiment.

Below, with reference to FIG. 4, the operation of the memory cell array in FIG. 1 of the present embodiment will be further explained. FIG. 4 specifically shows a waveform when "L" data is read from the memory cell 100 connected to the bit line BL0 and then "H" data is written thereto.

In FIG. 4, at t21, the semiconductor memory device is accessed by an external device, and the control circuit changes the level of the precharge control signal PC from H to L, so that the precharge operation applied to the bit lines BL and /BL is terminated.

Next, at time t22, the control circuit changes the level of the word lines WL0 and DWL2 from L to H, so as to select the target memory cell 100.

Accordingly, a signal corresponding to L-level data is read from the relevant bit cell 100 to the bit lines BL0 and BLS0, that is, the potential of the bit line BL0 is transmitted as the original to the bit line BLS0. On the other hand, from the relevant dummy memory cell 200, a signal having a voltage corresponding to half of the amount of the H-level data charge is read onto the bit lines /BL0 and /BLS0.

The control circuit sets the level of the isolating signal TG to L, so that the relevant isolating transistors 102 and 103 are OFF, and each pair of bit lines BL and /BL is isolated from the corresponding pair of bit lines BLS and /BLS.

Next, at time t23, that is, after the isolating signal TG is set to L, the control circuit activates the sense amplifiers 104. Accordingly, the relevant sense amplifier 104 compares the voltage levels of the bit lines BL0 and /BL0, and amplifies the difference, so that the level of the bit line BLS0 is set to L (0V), and the level of the bit line /BLS0 is set to H. That is, a variation in the electric potential of the relevant bit lines due to the corresponding data charge is amplified and held (i.e., latched).

At present, as the bit lines BL0 and /BL0 are isolated from the sense amplifier 104, they still hold the original potentials which have varied due to the data charge.

At time t24, the control circuit sets the level of the selection YS signal YS0 to H, so as to select the relevant sense amplifier 104, and to read the data stored in the selected sense amplifier 104.

In this process, with respect to the common data lines DL0 and /DL0, each of which has been precharged at the H-level, the sense amplifier 104 maintains the H-level of the common data line /DL0, and sets the level of the common data line DL0 to L, thereby transmitting (outputting) the relevant L-level data to the write/read circuit 106 by means of the above potential-level combination of the common data lines.

On the other hand, the control circuit sets the level of the precharge signal PC to H, and sets the level of the pair of bit lines BL0 and /BL0 to L (0V), so as to perform the precharge operation.

Next, at time t25, when a control signal for writing control is input from an external device, and "H" data is input as data to be written, the write/read circuit 106 complementarily sets (i) the common data line DL0 to H, and (ii) the common data line /DL0 to L, in correspondence to the input data.

In accordance with the selection YS signal corresponding to the address (provided from the external device) of the memory cell to which the data is written, the relevant sense-amplifier selector 105 selects the sense amplifier 104 corresponding to the bit line to which the memory cell is connected.

Accordingly, the sense amplifier 104, activated by the above selection, respectively sets the levels of the connected bit lines BLS0 and /BLS0 to H and L.

At present, as the pair of bit lines BL0 and /BL0 is isolated from the sense amplifier 104, the levels thereof are maintained at 0V ("L") set in the precharge operation. In addition, as the level of the word line WL0 is H, the access transistor 100A is ON, and no data charge is stored in the capacitor 100C of the relevant memory cell 100.

Next, until time t26, that is, until a precharge command is input into the DRAM and the rewriting and selected-cell release phase starts, it is possible to perform the continuous read/write access to each memory cell which belongs to a memory cell group (called a "page") selected by the relevant word line. Generally, the period in which such a page mode access is possible has an upper limit of a few ten to a few hundred microseconds.

That is, in the page mode access period, when the selection YS signal varies successively, each sense amplifier 104 which stores data read from the corresponding memory cell 100 is successively selected, so that the data read from each memory cell 100 is continuously output to the relevant write/read circuit 106.

Next, the precharge command is input into the DRAM, and the rewriting and selected-cell release phase starts with respect to the relevant memory cells 100.

That is, at time t26, the control circuit changes the level of the precharge control signal PC from H to L, so that the pair of bit lines BL0 and /BL0 is again set to 0V (L-level), and thus set to be in a floating state.

When the control circuit changes the level of the isolating signal TG from L to H, the pair of bit lines BLS and /BLS are each connected to the corresponding pair of bit lines BL and /BL, so that data (for rewriting) of the pair of bit lines BLS0 and /BLS0 is transmitted to the corresponding pair of bit lines BL0 and /BL0. In this process, the control circuit sets the level of the word lines WL0 and DWL2 to H.

Accordingly, in the same bit-line pair, the bit line BL0 has the H level while the bit line /BL0 has the L level, so that a data charge corresponding to the H level is written into the capacitor 100C of the relevant memory cell 100.

The control circuit then changes the level of the word lines WL0 and DWL2 from H to L, so as to release the selection of the relevant memory cell 100.

Next, at time t27, the control circuit changes the level of the precharge control signal PC from L to H, so that the bit lines BLS0 and BL0 are returned to 0V (i.e., L level), thereby completing the precharge of the relevant bit lines.

The write/read circuit 106 precharges the pair of common data lines DL0 and /DL0 to have the H level.

In accordance with the above-described operation, a series of the processes with respect to data reading from the relevant memory cell is completed.

Refresh Operation when Memory Cell 100 has "L" Data

Figure 5:
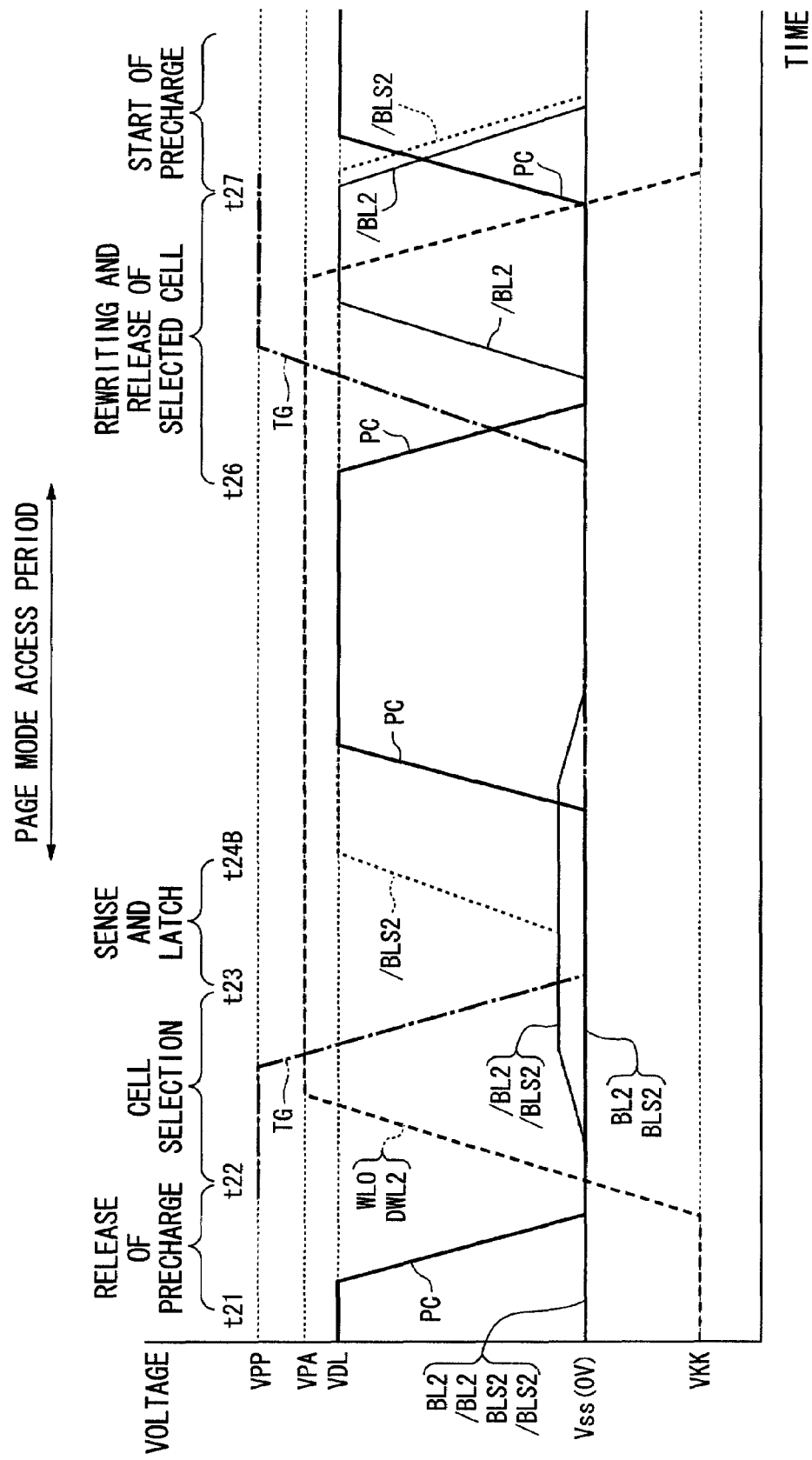
FIG. 5 is also a waveform diagram showing the operation of the semiconductor memory device in the first embodiment.

FIG. 5 is a waveform diagram with respect to the memory cell array in FIG. 1, and shows a state in which during the page mode access period, the relevant selection YS signal is not set to "H", that is, no sense amplifier 104 is selected as a target which outputs data.

FIG. 5 also shows a refresh operation in which "L" data, which is read from the relevant memory cell 100 and stored in the corresponding sense amplifier 104, is just rewritten. In FIG. 5, such an operation is applied to the pair of bit lines BL2 and /BL2.

In comparison with the operation shown in FIG. 4, during the page mode access period (from time t24B to t26), reading (at t24) and writing (at t25) are not performed with respect to the write/read circuit 106.

That is, at time t22, a data charge stored in the capacitor 100C of the relevant memory cell 100 is read, and at t26, the L-level data stored in the corresponding sense amplifier 104 is returned (as the original) to the memory cell 100. In FIG. 4, the bit line BL0 is set to H. In contrast, in FIG. 5, the bit line /BL2 is set to H. This is the only difference, and the other operations are similar for both figures, and detailed explanations thereof are omitted.

FIG. 6 is a table showing potential variations of a selected bit-line pair (e.g., the above-described pair of bit lines BL0 and /BL0) and a non-selected bit-line pair (e.g., the above-described pair of bit lines BL2 and /BL2) in each operational period appearing in FIGS. 2 to 5.

In accordance with the table of FIG. 6, each pair of bit lines BL and /BL in the memory cell array having the H-level word line is fixed at the L level (VSS), i.e. 0V, except for each predetermined period with respect to data reading and rewriting.

As such a period with respect to the data reading and rewriting is short (approximately 10 ns), each pair of bit lines BL and /BL in the memory cell array keeps 0V (VSS) in almost all periods. Therefore, no charge is stored in the relevant floating body, and it is possible to prevent data-charge leakage from the capacitor 100C of the relevant memory cell, due to a parasitic bipolar effect or a decrease in the threshold of the access transistor 100A.

Second Embodiment

Figure 7:
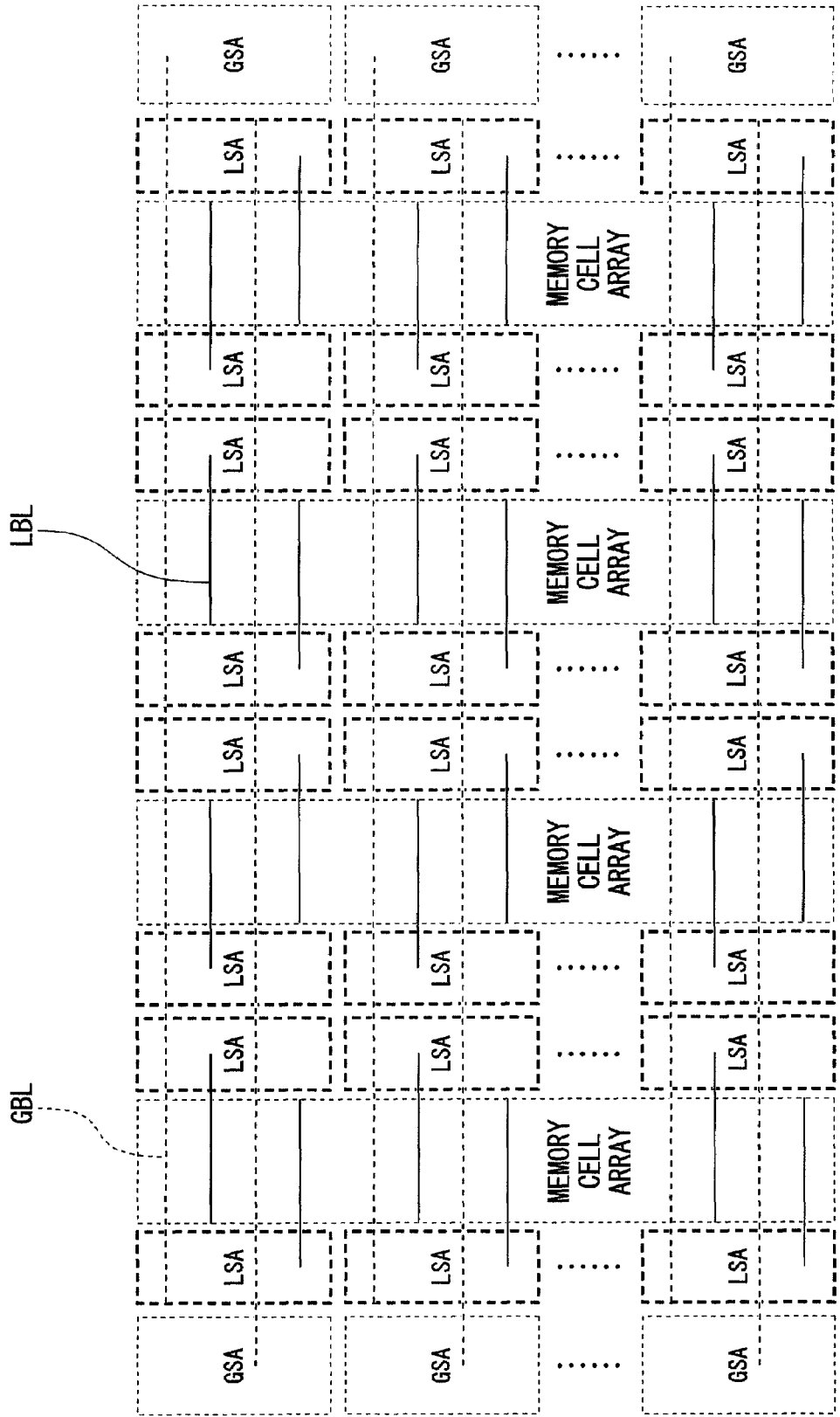
FIG. 7 is a block diagram showing the structure of a single-end sensing hierarchical memory cell array of a semiconductor memory device (DRAM) as a second embodiment of the present invention.
Figure 8:
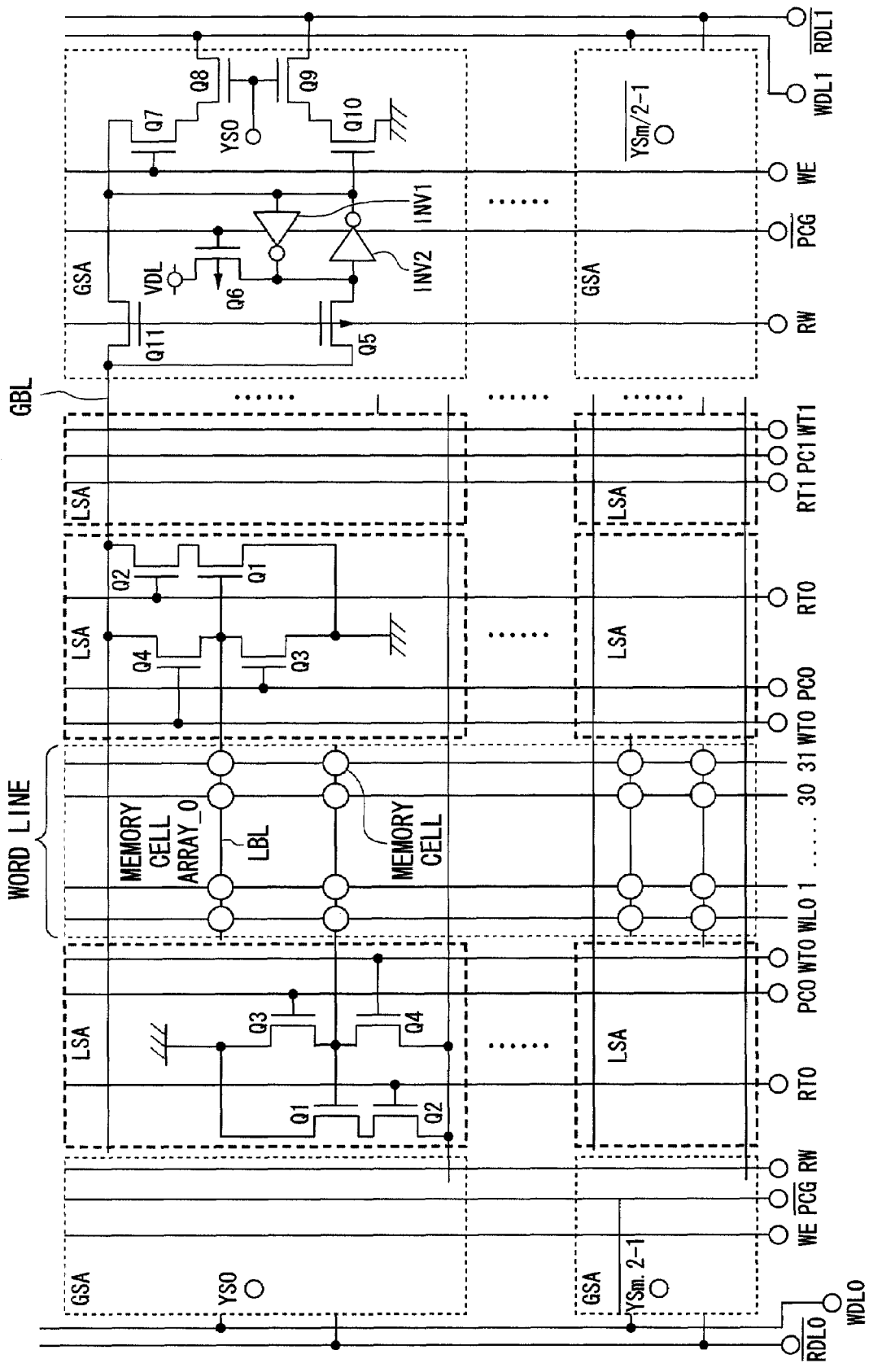
FIG. 8 is a schematic view showing the detailed structure of the semiconductor memory device in FIG. 7.
Figure 9:
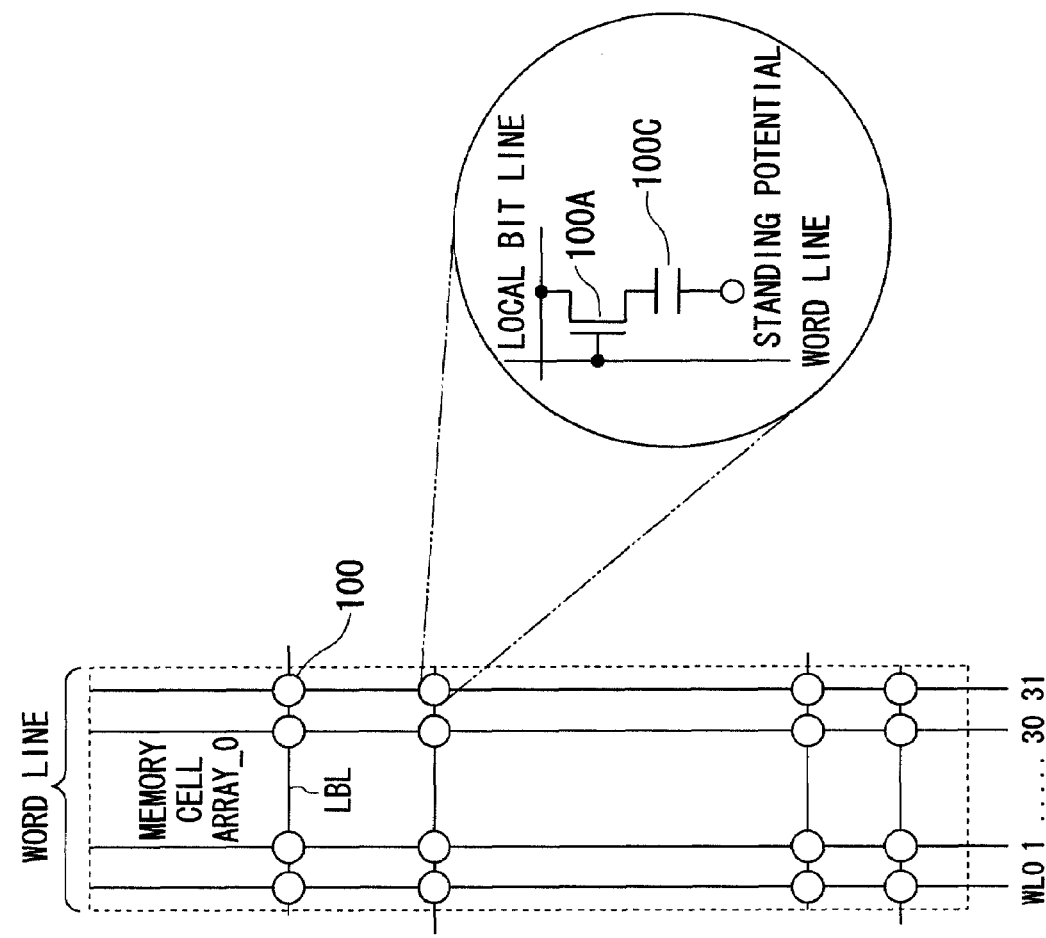
FIG. 9 is a schematic diagram showing the detailed structure of the memory cell array in FIG. 8.

FIGS. 7 to 9 are diagrams showing the structure of a semiconductor memory device (DRAM memory cell array) as a second embodiment of the present invention.

FIG. 7 is a diagram showing the general concept of the memory cell array, and shows a hierarchical structure including global bit lines GBLs and local bit lines LBLs, where each bit line is of a single-end type.

To each local bit line LBL, a local sense amplifier LSA of a single-end input type is connected. On the other hand, to each global bit line GBL, a global sense amplifier GSA of a single-end input type is connected.

When data is read from each memory cell, a control circuit (for controlling each part of the semiconductor memory device) connects a target local sense amplifier LSA to the relevant global bit line GBL. Accordingly, the local sense amplifier LSA first inverts and amplifies data read from the corresponding local bit line LBL, and transmits the amplified result to the connected global bit line GBL.

After that, the control circuit disconnects the local sense amplifier LSA and the global bit line GBL from each other.

When a rewriting and selected-cell release phase (for the memory cells) starts, the relevant global bit line GBL and the corresponding local sense amplifier LSA are connected to each other, so that the data on the global bit line GBL is transmitted via the local sense amplifier LSA to the corresponding local bit line LBL.

The data transmitted to the local bit line LBL is rewritten as a data charge to the capacitor 100C of the relevant memory cell.

The corresponding global sense amplifier GSA amplifies and holds (latches) the data of the global bit line GBL, and also returns the inverted data thereof to the global bit line GBL.

Additionally, in writing, the global sense amplifier GSA drives the global bit line GBL to have a voltage level (H or L) corresponding to the data written into the relevant memory cell.

FIG. 8 is a schematic view showing the detailed structure of the single-end sensing hierarchical memory cell array in FIG. 7.

As shown in FIG. 8, 32 word lines (WL0 to WL31) intersect each local bit line LBL, and a memory cell 100 is provided at each intersection. That is, each memory cell array is formed by the relevant local bit lines LBL, word lines WL, and memory cells. To each local bit line LBL, the corresponding local sense amplifier LSA is connected.

When the control circuit changes the level of a precharge (control) signal PC0 from L to H, a transistor Q3 is switched on, so that the local bit line LBL is precharged to the ground potential VSS (0V).

In accordance with the potential of the data read from the relevant memory cell 100 to the local bit line LBL (i.e., "H" or "L"), a transistor Q1 is set to ON (the on state) or OFF (the off state).

While the control circuit sets the level of a read/transfer signal RT0 to H, the transistor Q1 sets the level of the relevant global bit line GBL to L, or maintains the H level (precharged level) thereof, in accordance with the above ON/OFF state.

In each local sense amplifier LSA, transistors Q1 to Q4 are each an n-channel MOS transistor, which is switched on by applying the H-level potential to the gate thereof, and switched off by applying the L-level potential to the gate.

The transistors Q2 and Q1 are serially connected between the relevant global bit line GBL and the ground. The line of the read/transfer signal RT0 is connected to the gate of the transistor Q2, and the relevant local bit line LBL is connected to the gate of the transistor Q1.

The transistors Q4 and Q3 are also serially connected between the global bit line GBL and the ground. The wiring line of the precharge control signal PC0 is connected to the gate of the transistor Q3, and the wiring line of a write/transfer signal WT0 is connected to the gate of the transistor Q4.

While the control circuit sets the level of the read/transfer signal RT0 to H, it also sets the level of a read/write switching signal RW to L, so as to switch the transistor Q5 on, so that the relevant global bit line GBL is connected to the corresponding global sense amplifier GSA.

The global sense amplifier GSA has a latch formed by inverters INV1 and INV2, in which the input and output of one of them are respectively connected to the output and input of the other. The data input from the relevant local sense amplifier LSA is inverted and stored via the transistor Q5 into the latch. The stored data is output to the gate of a transistor Q10. Accordingly, when the control circuit sets the level of the selection YS signal YS0 (see FIG. 8) to H, a transistor Q9 is switched on, so that the data read from the relevant memory cell is output to a common read line "/RDL1". In this process, the level of the common read line /RDL1 is set to H by a read circuit (not shown). When the data stored in the latch is "H", then "L" data is output via the common read line /RDL1, and when data stored in the latch is "L", then the common read line /RDL1 maintains the H level.

In each global sense amplifier GSA, transistors Q5 and Q6 are each a p-channel MOS transistor, and transistors Q7 to Q11 are each an n-channel MOS transistor.

The drain, gate, and source of the transistor Q11 are respectively connected to the corresponding global bit line GBL, the wiring line of the read/write switching signal RW, and the source of the transistor Q7.

The source, gate, and drain of the transistor Q5 are respectively connected to the global bit line GBL, the wiring line of the read/write switching signal RW, and the drain of the transistor Q6.

The source, gate, and drain of the transistor Q6 are respectively connected to the wiring line of VDL, the wiring line of a precharge signal "/PCG", and the input of the above-described latch.

The source, gate, and drain of the transistor Q7 are respectively connected to the output of the above-described latch, the wiring line of a write signal WE, and the source of the transistor Q8.

The drain and gate of the transistor Q8 are respectively connected to a common write line WDL1 and the wiring line of the selection YS signal YS0.

The drain, gate, and source of the transistor Q9 are respectively connected to the common read line /RDL1, the wiring line of the selection YS signal YS0, and the drain of the transistor Q10.

The gate is of the transistor Q10 is connected to the output of the above-described latch and the source of the transistor Q7, and the source of Q10 is grounded.

In each precharge period, the control circuit sets the level of the read/write switching signal RW to L, and also sets the level of the precharge (control) signal /PCG (for precharging the corresponding global bit line GBL) to L. The precharge voltage of the global bit line GBL is set to the maximum voltage with respect to the amplitude of each local bit line LBL.

Accordingly, when the read/write switching signal RW is set to L, the transistor Q1 is switched off while the transistor Q5 is switched on, so that the level of the precharge signal /PCG is set to L, and the transistor Q6 is switched on.

When the transistor Q6 is switched on, H-level data is latched (stored) in the above-described latch, and the level of the global bit line GBL is set to H.

Next, in each data-reading period, the control circuit sets the level of the precharge signal /PCG (for precharging the global bit line GBL) to H, and also sets both levels of the write signal WE and the read/write switching signal RW to L.

Accordingly, the transistors Q11 and Q7 are switched off, so that the H-level of the global bit line GBL is maintained only by the signal output from the latch.

When the relevant local sense amplifier LSA is activated, the global bit line GBL is driven in accordance with H or L-level data output from LSA.

That is, (i) when the local sense amplifier LSA outputs H-level data, the global bit line GBL maintains the H level, and (ii) when the local sense amplifier LSA outputs L-level data, the level of the global bit line GBL is changed from H to L, so that the level of the data stored in the latch is also shifted from H to L.

In accordance with the address of a memory cell accessed from an external device, the control circuit selects the global sense amplifier GSA corresponding to the memory cell by setting the relevant selection YS signal YS0. Therefore, the common read (data) lines /RDL0 and /RDL1 are driven by means of the data stored in the latch (i.e., when "H" data is stored in the latch, the corresponding level thereof is set to H, and when "L" data is stored in the latch, the corresponding level thereof is set to L), so that the data stored in the relevant memory cell is read by an external device.

In this process, the level of the read/transfer signal RT0 is set to H, and the local sense amplifier LSA inverts and amplifies the potential of the local bit line LBL, which has varied in accordance with the data charge of the relevant memory cell selected by the word line. In accordance with the inverted and amplified data, the potential of the global bit line GBL is changed as described above, so that the data stored in the memory cell is output to the corresponding global sense amplifier GSA.

Next, in each data-writing period, the control circuit sets the read/write switching signal RW to H, so that the latch inverts the data received from the relevant global bit line GBL. In accordance with the inverted data, the global bit line GBL is again driven.

In this state, the control circuit sets the level of the write signal WE to H, and also sets the level of the selection YS signal YS0 to H, so that the transistors Q7 and Q8 are switched on.

To the selected global sense amplifier GSA, the data on the common write lines WDL0 and WDL1 is input, so that data writing to a memory cell (in the relevant memory cell array) corresponding to the input address occurs.

Therefore, when the common write lines WLD0 and WLD1 are each driven in accordance with data input into an input circuit (not shown), the data stored in the latch is updated by the data input via the transistor Q7, and the global bit line GBL is driven by means of the transistor Q11, thereby transmitting the data (to be written) to the global bit line GBL.

When the rewriting and selected-cell release phase starts, the control circuit sets the level of the write/transfer signal WT0 to H.

Accordingly, the transistor Q4 in the relevant local sense amplifier LSA is switched on, so that data (for rewriting to the relevant memory cell) held by the global bit line GBL or data (for writing) input via the common write lines WDL0 and WDL1 is transmitted to the corresponding local bit line LBL. Therefore, when the control circuit sets the level of the word line corresponding to the relevant address to H, the target data is written into the memory cell corresponding to the address.

In the present embodiment, as two global sense amplifiers GSA are selected by the selection YS signal YS0, reading or writing of 2-bit data is simultaneously performed, that is, with respect to two memory cells.

Additionally, as shown in FIG. 7, a plurality of local bit lines LBL are connected via corresponding local sense amplifiers LSA to a single global bit line GBL.

In each memory cell array which has no selected word line, each local bit line LBL and the corresponding local sense amplifier LSA are in the (fixed) non-selected state. In this case, as shown in FIG. 8, the global bit line GBL and the relevant local bit line LBL are disconnected by the control circuit which switches off the transistors Q2 and Q4.

In addition, as the local bit line LBL has the L-level potential by the control circuit which performs the precharge operation (i.e., switches on the transistor Q3 except for the data reading or writing operation), it is always set to the L level (0V), that is, in a precharged state.

FIG. 9 is a schematic diagram showing an example of the structure of the memory cell array in FIG. 8. In FIG. 9, a memory cell 100 is provided at the intersection between each word line WL and each local bit line LBL, and similar to the first embodiment, consists of the access transistor 100A and the capacitor 100C for storing a data charge.

The access transistor 100A is implemented by using a floating-body MOSFET such as a planar or pillar transistor formed on an SOI substrate.

Below, with reference to the waveform diagrams of FIGS. 10 to 13, the operation of the memory cell array (see FIG. 8) in the semiconductor memory device of the present embodiment will be explained.

"H" Data Reading from Memory Cell 100 and "L" Data Writing

Figure 10:
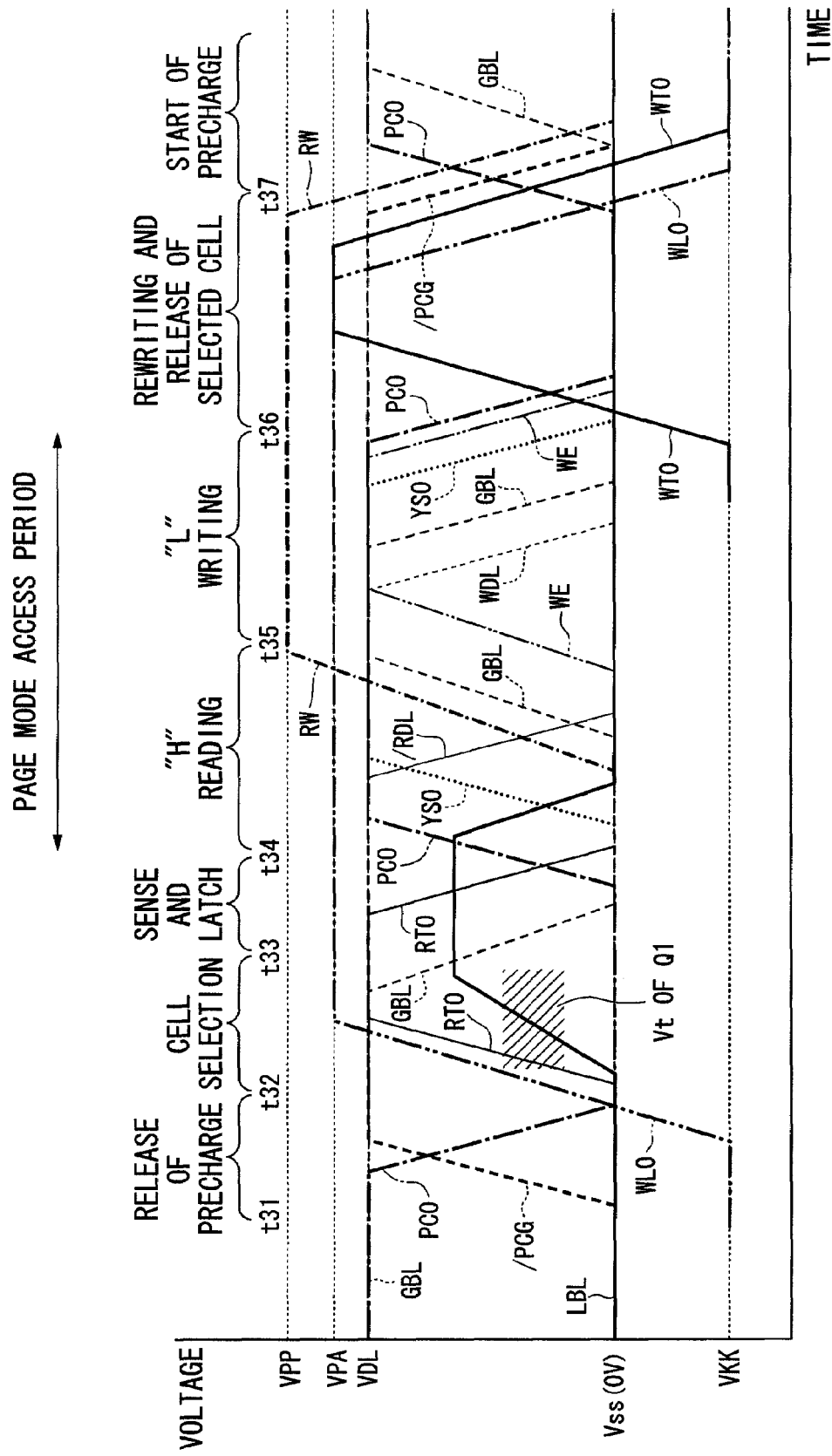
FIG. 10 is a waveform diagram showing the operation of the semiconductor memory device in the second embodiment.

FIG. 10 is a waveform diagram showing the operation of the memory array circuit (FIG. 8) of the present embodiment, and specifically shows a waveform when "H" data is read from the memory cell 100 and then "L" data is written thereto. In FIG. 10, the horizontal axis indicates time, and the vertical axis indicates voltage. The ground voltage Vss is 0V, and VDL indicates a general power-supply potential such as the H level of each bit line LBL or GBL. In addition, VKK and VPA respectively indicate the L and H levels of each word line WL and the write transfer signal WT, and the H level of the isolating signal TG is indicated by VPP. The above VKK has a negative voltage, and VPA and VPP are obtained by boosting VDL.

That is, VKK is set to a negative voltage so as to reduce leakage current when the access transistor 100A of the relevant memory cell 100 and the transistor Q4 are OFF. In addition, VPA and VPP each have a boosted potential for preventing the following potential drop. That is, when the connection between the access transistor 100A and the transistor Q4 and the connection between the global sense amplifier GSA and the global bit line GBL are performed and the relevant n-channel transistor is ON, the potential of the transmitted signal is prevented from dropping by a relevant threshold voltage Vt, so as to increase the potential of the signal by the threshold voltage with respect to the power-supply potential.

At time t31, the semiconductor memory device is accessed by an external device, and the control circuit shifts the level of the precharge (control) signal PC0 from H to L, and also shifts the level of the precharge (control) signal /PCG from L to H. While performing the precharge, the control circuit sets the level of the write/transfer signal WT0 to L, so as to switch off the transistor Q4 (corresponding to the isolating transistors 102 and 103 in the first embodiment), thereby disconnecting (i.e., isolating) the relevant local bit line LBL from the corresponding global bit line GBL. In this process, the control circuit sets the level of the read/write switching signal RW to L.

Accordingly, the precharge operation with respect to the relevant local bit line LBL and global bit line GBL is terminated, so that the local bit line LBL has a 0V potential in a floating state, and the global bit line GBL maintains the H level.

Next, at time t32, the control circuit shifts the level of the word line WL0 corresponding to the accessed memory address from L to H, and also shifts the level of the read/transfer signal RT0 from L to H.

Accordingly, the relevant access transistor 100A and the transistor Q2 are switched on, so that the potential of the corresponding local bit line LBL varies in accordance with a data charge stored in the capacitor 100C of the relevant memory cell 100. In this process, the potential of the local bit line LBL varies to have a potential higher than a threshold voltage Vt of the transistor Q1, by means of a data charge corresponding to "H" data.

The capacitance of the capacitor 100C is determined in advance so that when "H" data is stored, the potential of the relevant local bit line LBL shifts from the precharged L level to a value higher than the threshold voltage Vt.

Therefore, the potential of the global bit line GBL is decreased and set to the ground potential VSS (i.e., "L") via the transistors Q1 and Q2 which are ON.

Next, at time t33, the control circuit changes the level of the read/transfer signal RT0 from H to L. Accordingly, the transistor Q2 is switched off, and the relevant local bit line LBL is disconnected from the corresponding global bit line GBL.

At this point, data on the local bit line LBL is transmitted to the global bit line GBL, and the data is stored in the latch consisting of the inverters INV1 and INV2 in which the side toward the source of the transistor Q5 has the L level, and the side toward the gate of the transistor Q1 has the H level. Accordingly, the transistor Q1 is ON.

Next, at time t34, the control circuit changes the level of the precharge control signal PC0 from L to H, so that the transistor Q3 is switched on. Therefore, the local bit line LBL is connected to the ground via the transistor Q3, and thus is again precharged to the L level (again set to 0V).

The control circuit changes the level of the selection YS signal YS0 from L to H, so that the transistor Q9 is switched on. Accordingly, the common read line /RDL1, which has been precharged at the H level, is connected to the ground via the transistors Q9 and Q10 (i.e., set to the L level), so that H-level data is output from a write/read circuit (not shown).

The control circuit then changes the level of the read/write switching signal RW from L to H, so as to switch the operation state (or phase) of the semiconductor memory device from reading to writing.

Accordingly, the transistor Q5 is switched off, and the transistor Q11 is switched on, so that the global bit line GBL is driven at the H level similar to the read data.

In this process, as the transistor Q4 is OFF, the relevant local bit line LBL is disconnected from the corresponding global bit line GBL, and maintains the precharged L-level potential.

Next, at time t35, the control circuit changes the level of the write signal WE (with respect to the global bit line GBL) from L to H, so that the transistor Q7 is switched on.

In addition, the level of the common write line WDL1 is set to L in accordance with L-level data (for writing) input via the write/read circuit.

Accordingly, as the selection YS signal YS0 has the H level, the level of the global bit line GBL, which is selected by the selection YS signal YS0 via the transistors Q8 and Q7 in the on state, is changed from H to L. In this process, in the latch, the side toward the gate of the transistor Q10 is set to the L level.

At this time, as the transistor Q4 is OFF, the local bit line LBL is still disconnected from the corresponding global bit line GBL, and maintains the precharged L level.

When the data writing to the global bit line GBL is completed, the control circuit sequentially sets each level of the selection YS signal YS0 and the write signal WE from H to L.

Until a precharge command is input from an external device into the semiconductor memory device (i.e., DRAM) and a rewriting and selected-cell release phase starts (i.e., in a period from t34 to t36 in FIG. 10), it is possible to perform a continuous read/write access to each memory cell which belongs to a memory cell group (called a "page") selected by the relevant word line WL0. Generally, the period in which such a continuous read/write access is possible has an upper limit of a few ten to a few hundred microseconds.

Next, at time t36, the precharge command is input, and the rewriting and selected-cell release phase starts.

The control circuit changes the level of the precharge control signal PC0 from H to L, so that the transistor Q3 is switched off. As the transistor Q4 is also OFF, the local bit line LBL is disconnected from the corresponding global bit line GBL, and maintains the precharged L level in a floating state.

The control circuit changes the level of the write/transfer signal WT0 from L to H, so that the transistor Q4 is switched on, and the relevant global bit line GBL is connected to the corresponding local bit line LBL.

Accordingly, L-level data on the global bit line GBL is transmitted to the local bit line LBL. As the local bit line LBL has been precharged at the L level, the potential thereof does not change, but set to a state in which the L-level data is written.

The control circuit changes the level of the relevant word line WL from H to L, so that the access transistor 100A of the relevant memory cell 100 is switched off, and a data charge corresponding to "L" is stored into the corresponding capacitor 100C.

In addition, the control circuit changes the level of the write/transfer signal WT0 from H to L, so that the transistor Q4 is switched off, and the global bit line GBL and the local bit line LBL are disconnected from each other, thereby releasing the selected memory cell.

Next, at time t37, the control circuit again changes the level of the precharge control signal PC0 from L to H, so that the transistor Q3 is switched on, and the local bit line LBL is precharged to the L level.

The control circuit also changes each level of the precharge control signal /PCG and the read/write switching signal RW from H to L, so that the transistors Q5 and Q6 are switched on, and the global bit line GBL is precharged to the H level. In this process, in the latch, the side toward the source of the transistor Q5, that is, the input of INV2 and the output of INV1, maintains the H level.

In accordance with the above-described operation, the precharge with respect to the relevant local bit line LBL and the corresponding global bit line GBL is completed, and the series of the relevant processes is completed.

Refresh Operation when Memory Cell 100 has "H" Data

Below, with reference to FIG. 11, the operation of the memory cell array in FIG. 8 of the present embodiment will be further explained.

Figure 11:
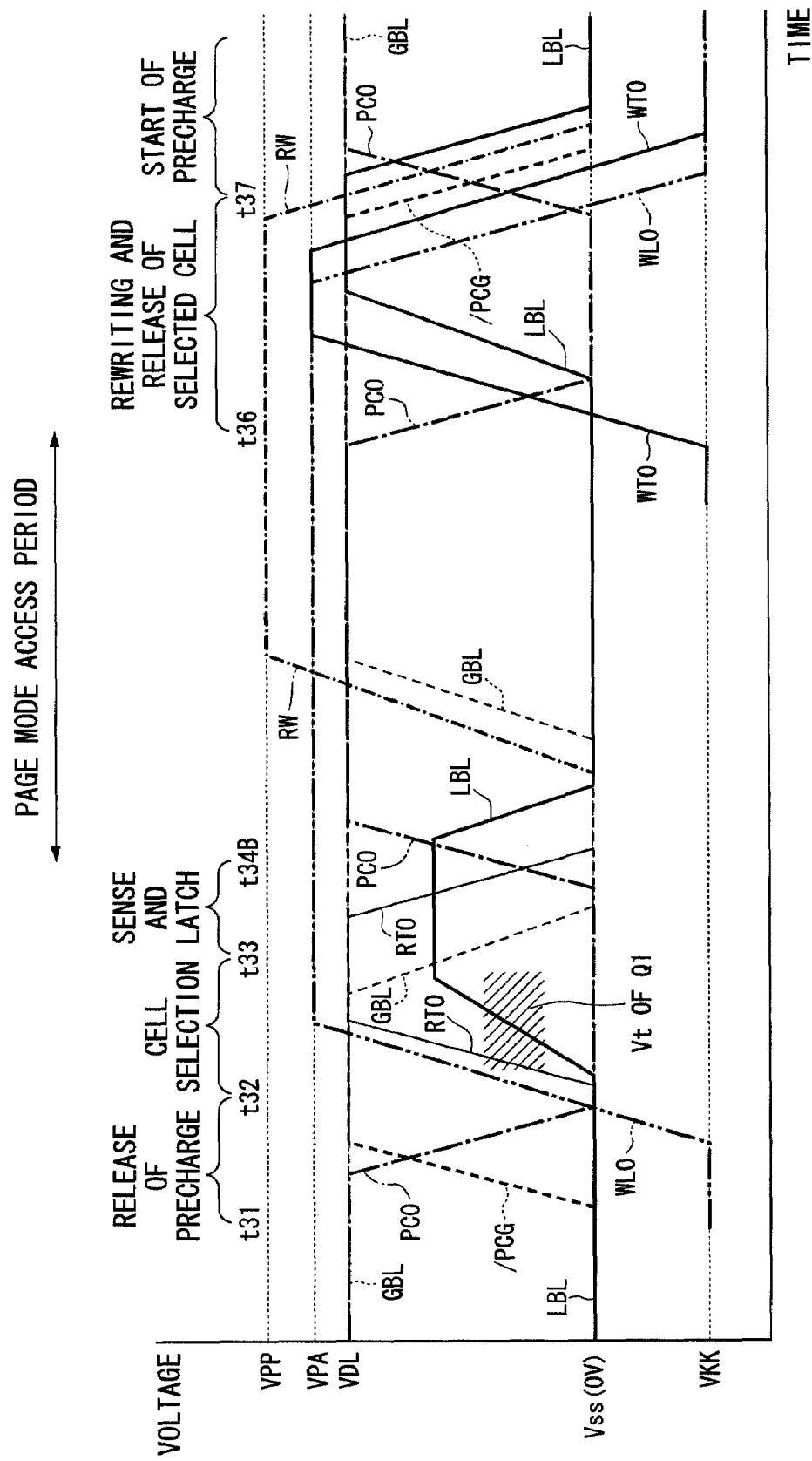
FIG. 11 is also a waveform diagram showing the operation of the semiconductor memory device in the second embodiment.

FIG. 11 is a waveform diagram with respect to the memory cell array in FIG. 8, and shows a state in which during the page mode access period, the relevant selection YS signal is not set to "H", that is, no global sense amplifier GSA is selected as a target which outputs data. FIG. 11 also shows a refresh operation in which "H" data, which is read from the relevant memory cell 100 and stored in the side (of the latch) toward the gate of the transistor Q10, is just rewritten.

In comparison with the operation shown in FIG. 10, during the page mode access period (from time t34B to t36), data loading (at t34) onto the common read line /RDL1 and data writing (at t35) from the common write line WDL1 are not performed.

That is, at time t32, a data charge stored in the capacitor 100C of the relevant memory cell 100 is read onto the relevant global bit line GBL, and at time t36, the H-level data stored in the global bit line GBL is returned (as the original) to the memory cell 100. In FIG. 10, in the relevant period, the level of the global bit line GBL is changed from H to L. In contrast, in FIG. 11, the global bit line GBL maintains the H level. Therefore, in the rewriting and selected-cell release phase, the level of the local bit line LBL is set to H, and then returned to the L level (0V) by the precharge operation. This is the only difference, and the other operations are similar for both figures, and detailed explanations thereof are omitted.

"L" Data Reading and "H" Data Writing with Respect to Memory Cell 100

Figure 12:
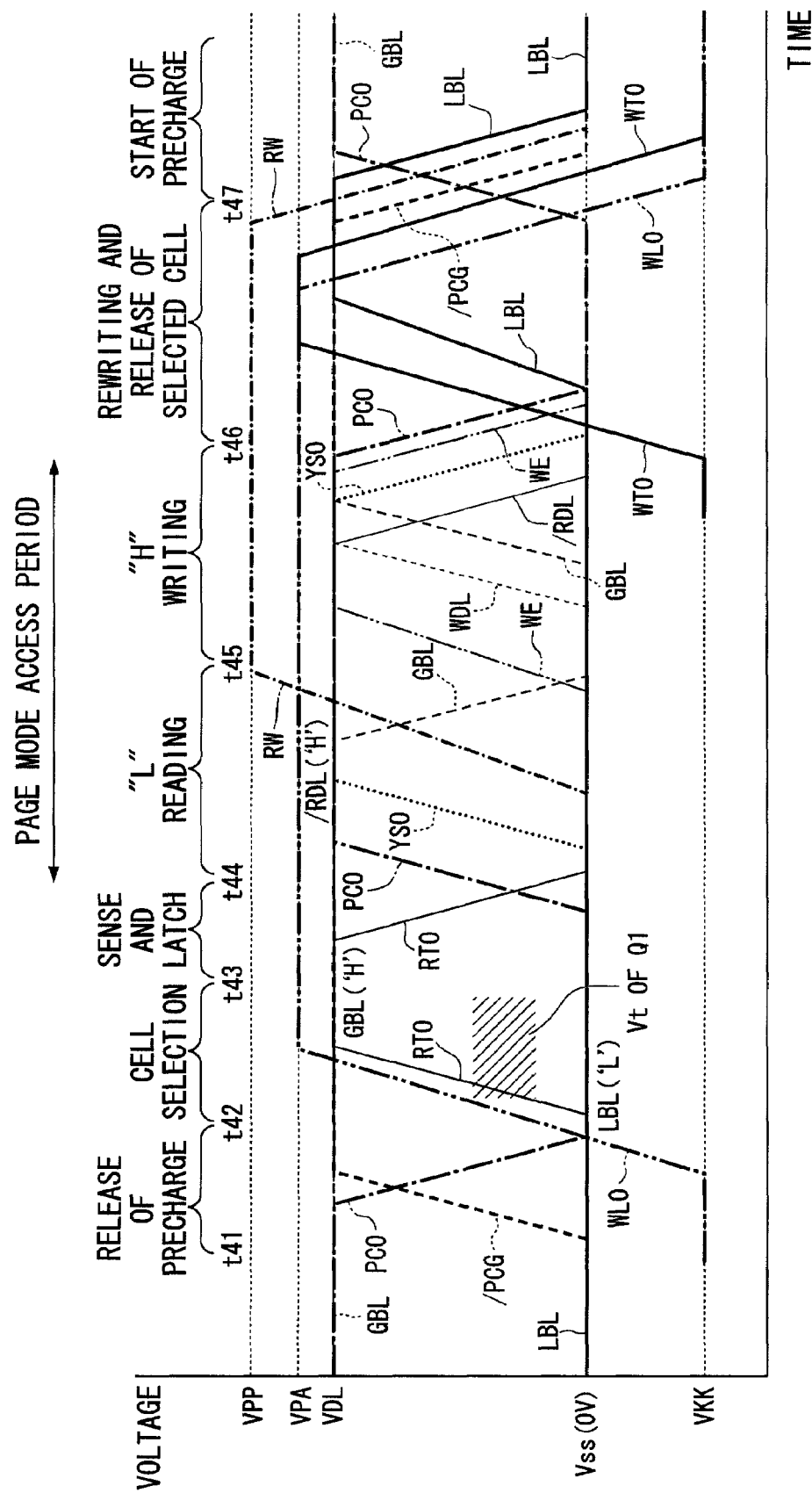
FIG. 12 is also a waveform diagram showing the operation of the semiconductor memory device in the second embodiment.

Below, with reference to FIG. 12, the operation of the memory cell array in FIG. 8 of the present embodiment will be further explained. FIG. 12 specifically shows a waveform when "L" data is read and then "H" data is written thereto.

At time t41, the semiconductor memory device is accessed by an external device, and the control circuit shifts the level of the precharge (control) signal PC0 from H to L, and also shifts the level of the precharge (control) signal /PCG from L to H. While performing the precharge, the control circuit sets the level of the write/transfer signal WT0 to L, so as to switch off the transistor Q4, thereby disconnecting the relevant local bit line LBL from the corresponding global bit line GBL. In this process, the control circuit sets the level of the read/write switching signal RW to L.

Accordingly, the precharge operation with respect to the relevant local bit line LBL and global bit line GBL is terminated, so that the local bit line LBL has a 0V potential in a floating state, and the global bit line GBL maintains the H level.

Next, at time t42, the control circuit shifts the level of the word line WL0 corresponding to the accessed memory address from L to H, and also shifts the level of the read/transfer signal RT0 from L to H.

Accordingly, the relevant access transistor 100A and the transistor Q2 are switched on, so that the potential of the corresponding local bit line LBL varies in accordance with a data charge stored in the capacitor 100C of the relevant memory cell 100. In this process, the variation in the potential of the local bit line LBL is lower than the threshold voltage Vt of the transistor Q1, by means of a data charge corresponding to "L" data.

The capacitance of the capacitor 100C is determined in advance so that when "L" data is stored, the potential of the relevant local bit line LBL varies from the precharged L level to a value lower than the threshold voltage Vt.

As the transistor Q1 is OFF, the H-level potential of the global bit line GBL is maintained (i.e., data is stored in the latch).

Next, at time t43, the control circuit changes the level of the read/transfer signal RT0 from H to L. Accordingly, the transistor Q2 is switched off, and the relevant local bit line LBL is disconnected from the corresponding global bit line GBL.

At this point, data on the local bit line LBL is transmitted to the global bit line GBL, and the data is stored in the latch consisting of the inverters INV1 and INV2 in which the side toward the source of the transistor Q5 has the H level, and the side toward the gate of the transistor Q10 has the L level. Accordingly, the transistor Q10 is OFF.

Next, at time t44, the control circuit changes the level of the precharge control signal PC0 from L to H, so that the transistor Q3 is switched on. Therefore, the local bit line LBL is connected to the ground via the transistor Q3, and thus is precharged to the L level (again set to 0V).

The control circuit changes the level of the selection YS signal YS0 from L to H, so that the transistor Q9 is switched on. However, as the transistor Q10 is OFF, the potential of the common read line /RDL1, which has been precharged at the H level, is not changed, so that L-level data is output from a write/read circuit (not shown).

The control circuit then changes the level of the read/write switching signal RW from L to H, so as to switch the operation state (or phase) of the semiconductor memory device from reading to writing.

Accordingly, the transistor Q5 is switched off, and the transistor Q11 is switched on, so that the global bit line GBL is driven at the L level similar to the read data.

In this process, as the transistor Q4 is OFF, the relevant local bit line LBL is disconnected from the corresponding global bit line GBL, and maintains the precharged L-level potential.

Next, at time t45, the control circuit changes the level of the write signal WE (with respect to the global bit line GBL) from L to H, so that the transistor Q7 is switched on.

In addition, the level of the common write line WDL1 is set to H in accordance with H-level data (for writing) input via the write/read circuit.

Accordingly, as the selection YS signal YS0 has the H level, the level of the global bit line GBL, which is selected by the selection YS signal YS0 via the transistors Q8 and Q7 in the on state, is changed from L to H. In this process, in the latch, the side toward the gate of the transistor Q10 is set to the H level.

At this time, as the transistor Q4 is OFF, the local bit line LBL is still disconnected from the corresponding global bit line GBL, and maintains the precharged L level.

When the data writing to the global bit line GBL is completed, the control circuit sequentially sets each level of the selection YS signal YS0 and the write signal WE from H to L.

Until a precharge command is input from an external device into the semiconductor memory device (i.e., DRAM) and a rewriting and selected-cell release phase starts (i.e., in a period from t44 to t46 in FIG. 12), it is possible to perform a continuous read/write access to each memory cell which belongs to a memory cell group (called a "page") selected by the relevant word line WL0. Generally, the period in which such a continuous read/write access is possible has an upper limit of a few ten to a few hundred microseconds.

Next, at time t46, the precharge command is input, and the rewriting and selected-cell release phase starts.

The control circuit changes the level of the precharge control signal PC0 from H to L, so that the transistor Q3 is switched off. As the transistor Q4 is also OFF, the local bit line LBL is disconnected from the corresponding global bit line GBL, and maintains the precharged L level in a floating state.

The control circuit changes the level of the write/transfer signal WT0 from L to H, so that the transistor Q4 is switched on, and the relevant global bit line GBL is connected to the corresponding local bit line LBL.

Accordingly, H-level data on the global bit line GBL is transmitted to the local bit line LBL, and the level of the potential of the local bit line LBL is changed from the precharged L to H, so that H-level data is written.

The control circuit changes the level of the relevant word line WL from H to L, so that the access transistor 100A of the relevant memory cell 100 is switched off, and a data charge corresponding to "H" is stored into the corresponding capacitor 100C.

In addition, the control circuit changes the level of the write/transfer signal WT0 from H to L, so that the transistor Q4 is switched off, and the global bit line GBL and the local bit line LBL are disconnected from each other, thereby releasing the selected memory cell.

Next, at time t47, the control circuit again changes the level of the precharge control signal PC0 from L to H, so that the transistor Q3 is switched on, and the local bit line LBL is precharged to the L level.

The control circuit also changes each level of the precharge control signal /PCG and the read/write switching signal RW from H to L, so that the transistors Q5 and Q6 are switched on, and the global bit line GBL is precharged to the H level. In this process, in the latch, the side toward the source of the transistor Q5, that is, the input of INV2 and the output of INV1, maintains the H level.

In accordance with the above-described operation, the precharge with respect to the relevant local bit line LBL and the corresponding global bit line GBL is completed, and the series of the relevant processes is completed.

Refresh Operation when Memory Cell 100 has "L" Data

Below, with reference to FIG. 13, the operation of the memory cell array in FIG. 8 of the present embodiment will be further explained.

Figure 13:
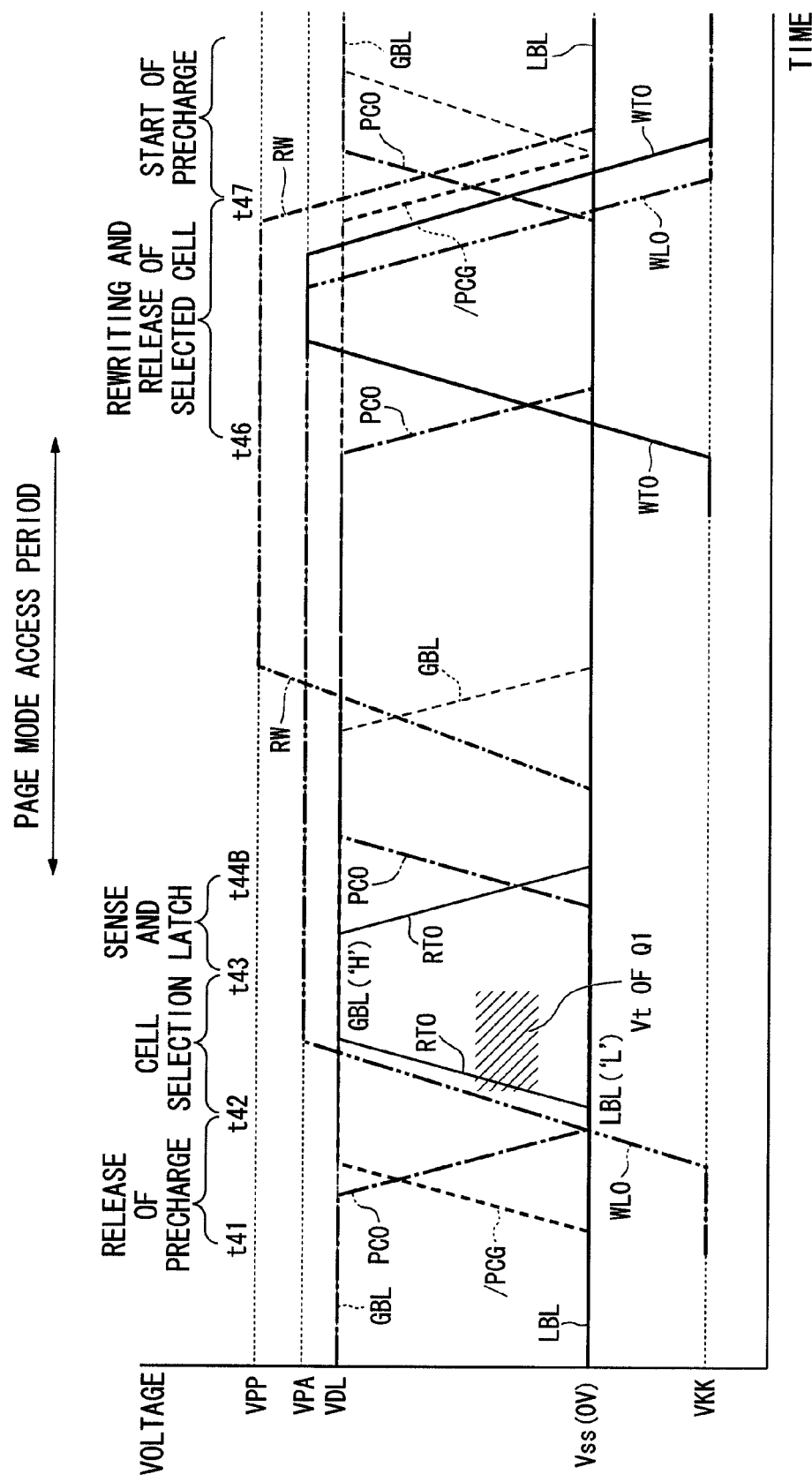
FIG. 13 is also a waveform diagram showing the operation of the semiconductor memory device in the second embodiment.

FIG. 13 is a waveform diagram with respect to the memory cell array in FIG. 8, and shows a state in which during the page mode access period, the relevant selection YS signal is not set to "H", that is, no global sense amplifier GSA is selected as a target which outputs data. FIG. 13 also shows a refresh operation in which "L" data, which is read from the relevant memory cell 100 and stored in the side (of the latch) toward the gate of the transistor Q10, is just rewritten.

In comparison with the operation shown in FIG. 12, during the page mode access period (from time t44B to t46), data loading (at t44) onto the common read line /RDL1 and data writing (at t45) from the common write line WDL1 are not performed.

That is, at time t42, a data charge stored in the capacitor 100C of the relevant memory cell 100 is read onto the relevant global bit line GBL, and at time t46, the L-level data stored in the global bit line GBL is returned (as the original) to the memory cell 100. In FIG. 12, in the relevant period, the level of the global bit line GBL is changed from L to H. In contrast, in FIG. 13, the global bit line GBL maintains the L level. Therefore, in the rewriting and selected-cell release phase, the level of the local bit line LBL is set to L, and also set to the L level (0V) by the precharge operation. This is the only difference, and the other operations are similar for both figures, and detailed explanations thereof are omitted.

FIG. 14 is a table showing potential variations of a selected local bit line LBL, a selected global bit line GBL, a non-selected local bit line LBL, and a non-selected global bit line GBL in each operational period appearing in FIGS. 10 to 13.

In accordance with the table of FIG. 14, each local bit line LBL in the memory cell array having the H-level word line is fixed at the L level (VSS), i.e. 0V, except for each predetermined period with respect to data reading and rewriting.

As such a period with respect to the data reading and rewriting is short (approximately 10 ns), each local bit line LBL in the memory cell array keeps 0V (VSS) in almost all periods. Therefore, no charge is stored in the relevant floating body, and it is possible to prevent data-charge leakage from the capacitor 100C of the relevant memory cell, due to a parasitic bipolar effect or a decrease in the threshold of the access transistor 100A.

While preferred embodiments of the invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A semiconductor memory device comprising:
   a memory cell having a field effect transistor of a floating body type, and a capacitor for storing a data charge;
   a bit line to which one of the source and the drain of the field effect transistor is connected;
   a precharging device for performing precharge control of the bit line so that the bit line has a predetermined precharge voltage;
   a sense amplifier for amplifying and storing the potential of the bit line, which is set in accordance with the data charge read from the memory cell;
   a switching device, provided between the bit line and the sense amplifier, for performing selective connection therebetween; and
   a control part for controlling the precharging device, the sense amplifier, and the switching device, wherein
   except for each period for performing data reading or writing, the control part makes the precharging device perform the precharge control of the bit line and makes the switching device disconnect the bit line and the sense amplifier from each other.

2. The semiconductor memory device in accordance with claim 1, wherein:
   when performing the data reading and rewriting, the control part:
      makes the sense amplifier amplify the data charge read onto the bit line, and then switches off the switching device so as to disconnect the bit line and the sense amplifier from each other;
      makes the precharging device precharge the bit line to the predetermined precharge voltage; and
      switches on the switching device so as to connect the bit line and the sense amplifier to each other, thereby writing the data stored in the sense amplifier into the memory cell.

3. The semiconductor memory device in accordance with claim 1, wherein:
   when performing the data writing, the control part:
      switches off the switching device so as to disconnect the bit line and the sense amplifier from each other;
      makes the sense amplifier amplify data which is input from an external device;
      makes the precharging device precharge the bit line to the predetermined precharge voltage; and
      switches on the switching device so as to connect the bit line and the sense amplifier to each other, thereby writing the data stored in the sense amplifier into the memory cell.

4. The semiconductor memory device in accordance with claim 1, further comprising:
   a global bit line, to which a plurality of the bit lines are connected as local bit lines, is provided, wherein:
   the sense amplifier is connected to one end of the global bit line; and
   the switching device is provided between the other end of the global bit line and each local bit line.

5. The semiconductor memory device in accordance with claim 4, wherein:

the switching device is provided between each local bit line and the global bit line; and the control part switches on the switching device corresponding to selected one of the local bit lines, so as to connect the selected local bit line to the global bit line, and switches off the switching device corresponding to each non-selected local bit line.

6. The semiconductor memory device in accordance with claim 1, wherein:

with given first and second potentials which respectively correspond to the minimum and maximum voltage levels with respect to the amplitude of the bit line, the predetermined precharge voltage is equal to the first potential.

7. The semiconductor memory device in accordance with claim 1, wherein:

with given first and second potentials which respectively correspond to the minimum and maximum voltage levels with respect to the amplitude of the bit line, the predetermined precharge voltage is lower than the first potential.

8. The semiconductor memory device in accordance with claim 1, wherein:

the field effect transistor is a planar transistor formed on a silicon substrate having an SOI structure.

9. The semiconductor memory device in accordance with claim 1, wherein:

the field effect transistor is a pillar transistor in which one of the source and drain is formed in an upper part of a silicon pillar, and the other is formed in a lower part thereof.

* * * * *